(12) United States Patent
Green et al.

(10) Patent No.: US 11,031,220 B2
(45) Date of Patent: Jun. 8, 2021

(54) ION DETECTION SYSTEM

(71) Applicant: MICROMASS UK LIMITED, Wilmslow (GB)

(72) Inventors: Martin Raymond Green, Bowdon (GB); Jason Lee Wildgoose, Stockport (GB)

(73) Assignee: Micromass UK Limited, Wilmslow (GB)

(*) Notice: Subject to any disclaimer, the term of this patent is extended or adjusted under 35 U.S.C. 154(b) by 192 days.

(21) Appl. No.: 16/345,149

(22) PCT Filed: Oct. 25, 2017

(86) PCT No.: PCT/GB2017/053213
§ 371 (c)(1),
(2) Date: Apr. 25, 2019

(87) PCT Pub. No.: WO2018/078358
PCT Pub. Date: May 3, 2018

(65) Prior Publication Data
US 2019/0287777 A1    Sep. 19, 2019

(30) Foreign Application Priority Data
Oct. 25, 2016    (GB) .................................... 1618023

(51) Int. Cl.
*H01J 37/244* (2006.01)
*H01J 49/02* (2006.01)
(Continued)

(52) U.S. Cl.
CPC .......... *H01J 49/025* (2013.01); *H01J 37/244* (2013.01); *H01J 43/025* (2013.01); *H01J 43/246* (2013.01);
(Continued)

(58) Field of Classification Search
CPC ...... H01J 49/025; H01J 49/0036; H01J 49/40; H01J 49/401; H01J 37/244; H01J 43/025; H01J 43/246; H01J 2237/24435
(Continued)

(56) References Cited

U.S. PATENT DOCUMENTS 6,756,587 B1    6/2004  Bateman et al.
7,555,185 B2    6/2009  Laprade et al.
(Continued)

FOREIGN PATENT DOCUMENTS

EP    2110845 A1    10/2009
WO    2004/051850 A2    6/2004
WO    2012/080443 A1    6/2012

OTHER PUBLICATIONS

Search Report for United Kingdom Application No. GB1618023.4 dated Feb. 23, 2017.
(Continued)

*Primary Examiner* — Kiet T Nguyen
(74) *Attorney, Agent, or Firm* — Kacvinsky Daisak Bluni PLLC

(57) ABSTRACT

An ion detection system is disclosed that comprises one or more first devices (11) configured to produce secondary electrons in response to incident ions. The one or more first devices (11) comprise a first ion collection region and a second ion collection region and are configured to produce first secondary electrons in response to one or more ions incident at the first ion collection region and to produce second secondary electrons in response to one or more ions incident at the second ion collection region. The ion detection system also comprises a first output device (14) configured to output a first signal in response to first secondary electrons produced by the one or more first devices (11) and a second output device (15) configured to output a second
(Continued)

signal in response to second secondary electrons produced by the one or more first devices (11).

20 Claims, 16 Drawing Sheets

(51) Int. Cl.
  *H01J 43/24* (2006.01)
  *H01J 49/40* (2006.01)
  *H01J 43/02* (2006.01)
  *H01J 49/00* (2006.01)

(52) U.S. Cl.
  CPC .......... *H01J 49/0036* (2013.01); *H01J 49/40* (2013.01); *H01J 49/401* (2013.01); *H01J 2237/24435* (2013.01)

(58) Field of Classification Search
  USPC ....................................................... 250/287
  See application file for complete search history.

(56) References Cited

U.S. PATENT DOCUMENTS

| | | | |
|---|---|---|---|
| 7,687,759 | B2 | 3/2010 | Brown et al. |
| 9,324,545 | B2 | 4/2016 | Green et al. |
| 2002/0175292 | A1 | 11/2002 | Whitehouse et al. |
| 2003/0001090 | A1 | 1/2003 | Ranasinghe et al. |
| 2003/0111597 | A1 | 6/2003 | Gonin et al. |
| 2004/0149900 | A1 | 8/2004 | Makarov et al. |
| 2005/0040325 | A1 | 2/2005 | Gonin |
| 2006/0020400 | A1 | 1/2006 | Okamura et al. |
| 2007/0236118 | A1 | 10/2007 | Laprade et al. |
| 2007/0268171 | A1 | 11/2007 | Hidalgo et al. |
| 2008/0121796 | A1 | 5/2008 | Green et al. |
| 2009/0114808 | A1* | 5/2009 | Bateman ............. H01J 49/0036 250/282 |
| 2009/0134312 | A1 | 5/2009 | Brown et al. |
| 2009/0321628 | A1* | 12/2009 | Bateman ............. H01J 49/0036 250/282 |
| 2010/0213361 | A1 | 8/2010 | Green et al. |
| 2012/0126110 | A1* | 5/2012 | Green ................. H01J 49/0036 250/282 |
| 2013/0268212 | A1* | 10/2013 | Makarov ............. H01J 49/0036 702/32 |
| 2015/0136971 | A1 | 5/2015 | Green et al. |

OTHER PUBLICATIONS

Combined Search Report for United Kingdom Application No. GB1717518.3 dated Apr. 26, 2018.

International Search Report and Written Opinion for International Application No. PCT/GB2017/053213 dated Jan. 26, 2018.

Mares J. A., et al., "Hybrid photomultipliers—their properties and application in scintillation studies," Optical Materials 30:22-25, 2007.

Examination Report under Section 18(3) for Application No. GB1717518.3, dated Apr. 9, 2021, 6 pages.

* cited by examiner

ION DETECTION SYSTEM

CROSS-REFERENCE TO RELATED APPLICATION

This application is a national phase filing claiming the benefit of and priority to International Patent Application No. PCT/GB2017/053213, filed on Oct. 25, 2017, which claims priority from and the benefit of United Kingdom patent application No. 1618023.4 filed on Oct. 25, 2016. The entire contents of these applications are incorporated herein by reference.

FIELD OF THE INVENTION

The present invention relates generally to ion detection systems and in particular to analytical instruments such as mass and/or ion mobility spectrometers that comprise ion detection systems.

BACKGROUND

In state of the art orthogonal-acceleration time-of-flight ("oa-ToF") mass spectrometers, ion arrival rates of more than 1500 ions per species (peak) in a single time of flight transient (push) have been demonstrated for continuous beam operation. At modest electron multiplier gains of $2e^5$ and for an ion arrival envelope having a 1 ns full width at half maximum ("FWHM"), 1500 ions per push ("ipp") results in an approximately 2.4 V pulse directly from the electron multiplier (assuming 50 ohm output impedance).

This pulse is within the maximum pulse linearity of most electron multipliers used for time of flight mass spectrometers such as continuous or discrete dynode detectors or micro-channel plates. Linear pulses of between 3 to 20 V can be produced by these detectors under similar conditions.

It is common to combine ion mobility separation ("IMS") with time of flight mass spectrometry ("ToF-MS") to produce nested ion mobility-mass to charge ratio ("m/z") data sets. For this mode of operation, ions of a given species are no longer delivered as a continuous beam over some period of time but are instead concentrated into narrow ion mobility peaks. For example, a typical IMS separation may take 20 ms, and an IMS peak may have a FWHM of 0.3 ms. Therefore, for the same average ion current per unit time, the ion arrival rate may increase by a factor of approximately 60.

It is therefore desired to produce an ion detection system, e.g. a combination of an ion-to-electron multiplier system and a downstream analogue to digital recording system, that is capable of quantitatively recording both low and high ion arrival rates, e.g. from single ion arrivals in individual time of flight ("ToF") transients to ion arrival rates of 90,000 ipp or more for individual mass to charge ratio ("m/z") species in IMS operation.

It is known to attach the output from a single electron multiplier to two analogue to digital converters (ADCs) via two different amplification stages to increase the dynamic range of an ion detection system. For example, in US 2010/0213361 (Micromass) the output from a single secondary electron collection electrode is split into two signal paths. The resulting split signals are amplified by different amounts, digitised by separate ADCs, and then combined to produce a combined data set that has an increased dynamic range.

However, it would be difficult to extend this approach to higher dynamic range, e.g. by simply splitting the signal between more amplifiers and ADCs.

This is firstly because the input to the amplification stages for each ADC is common, and saturation of the input for one of the amplifiers (e.g. the higher gain amplifier) can affect the input conditions for the other amplifier(s) (e.g. the lower gain amplifier(s)) leading to signal distortion and mass measurement inaccuracies.

Secondly, each time the signal is split, the overall signal intensity is reduced. It may then be necessary to increase the gain of the electron multiplier to ensure efficient detection of single ion arrivals. However, the maximum output pulse of the electron multiplier may then be exceeded at high ion arrival rates, leading to a non-linear response.

It is therefore desired to provide an improved ion detection system.

SUMMARY

According to a first aspect there is provided an ion detection system comprising:

one or more first devices configured to produce secondary electrons in response to incident ions, the one or more first devices comprising a first ion collection region and a second ion collection region, wherein the one or more first devices are configured to produce first secondary electrons in response to one or more ions incident at the first ion collection region and to produce second secondary electrons in response to one or more ions incident at the second ion collection region;

a first output device configured to output a first signal in response to first secondary electrons produced by the one or more first devices; and a second output device configured to output a second signal in response to second secondary electrons produced by the one or more first devices.

The ion detection system may further comprise:

a digitiser configured to digitise the first signal to produce a first digitised signal;

a digitiser configured to digitise the second signal to produce a second digitised signal;

processing circuitry configured to determine first intensity and arrival time, mass or mass to charge ratio data from the first digitised signal;

processing circuitry configured to determine second intensity and arrival time, mass or mass to charge ratio data from the second digitised signal; and processing circuitry configured to combine the first intensity and arrival time, mass or mass to charge ratio data and the second intensity and arrival time, mass or mass to charge ratio data to form a combined data set.

Various embodiments are directed to an ion detection system that comprises one or more first ion-to-electron devices that produce secondary electrons in response to incident ions, where the one or more first devices comprise at least a first ion collection region and a second different ion collection region, and produces first secondary electrons in response to ions incident at the first region, and produces second secondary electrons in response to ions incident at the second region. The ion detection system comprises first and second output devices, e.g. first and second electrodes, that respectively output first and second signals in response to the first and second secondary electrons being produced by the one or more first devices, i.e. respectively in response to ions incident at the first and second ion collection regions.

The first and second signals output by the first and second output devices are digitised, e.g. by respective first and second digitisers, and converted to first and second intensity and arrival time, mass or mass to charge ratio data. The first and second intensity and arrival time, mass or mass to charge ratio data are combined to form a combined data set.

Thus, rather than splitting the output from a single collection electrode between two digitisers in accordance with US 2010/0213361 (Micromass), in various embodiments secondary electrons produced by one or more first ion-to-electron devices are split between two (or more) different output devices, e.g. two (or more) different electrodes. The resulting output signals are then combined.

As will be described in more detail below, this arrangement facilitates increased dynamic range ion detection systems, e.g. when compared with the arrangement of US 2010/0213361 (Micromass), and can avoid the above mentioned problems associated with splitting the output from a single collection electrode between multiple digitisers (i.e. the problems associated with saturation of the input for one of the amplifiers affecting the input conditions for the other amplifier(s), and the problems associated with increasing the gain of the ion-to-electron (electron multiplier) device).

Furthermore, according to various embodiments, the outputs from the first and second output devices are combined by firstly determining respective intensity and arrival time, mass or mass to charge ratio data (e.g. peak detecting the digitised signals), and then combining the resulting intensity and arrival time, mass or mass to charge ratio data (e.g. time and intensity pairs) to form a combined data set. This arrangement provides a convenient method by which the signals may be combined, and e.g. can beneficially remove the need for complex calibration and clock phase locking between the first and second digitisers.

It will be appreciated, therefore, that various embodiments provide an improved ion detection system.

The first output device and/or the first ion collection region may have a first effective area, and the second output device and/or the second ion collection region may have a second different effective area.

The one or more first devices may comprise one or more inactive regions.

The one or more inactive regions may be arranged to prevent the first output device outputting a first signal and the second output device outputting a second signal in response to a single ion incident at the one or more first devices.

According to an aspect there is provided an ion detection system comprising:

one or more micro-channel plate ("MCP") devices, the one or more micro-channel plate devices comprising a first active region, a second active region, and one or more inactive regions, wherein the one or more micro-channel plate ("MCP") devices are configured to produce first secondary electrons in response to one or more ions or electrons incident at the first active region and to produce second secondary electrons in response to one or more ions or electrons incident at the second active region;

a first output device configured to output a first signal in response to first secondary electrons produced by the one or more micro-channel plate ("MCP") devices; and a second output device configured to output a second signal in response to second secondary electrons produced by the one or more micro-channel plate ("MCP") devices;

wherein the one or more inactive regions are arranged to prevent the first output device outputting a first signal and the second output device outputting a second signal in response to a single ion or a single electron incident at the one or more micro-channel plate ("MCP") devices.

The one or more first devices may comprise a micro-channel plate ("MCP") device comprising a first active region, a second different active, and one or more inactive regions; and the one or more inactive regions may be arranged between the first active region and the second active region so as to prevent the first output device outputting a first signal and the second output device outputting a second signal in response to a single ion incident at the one or more first devices.

The first signal may be multiplied, amplified or attenuated by a first gain prior to being digitised by the (first) digitiser, and the second signal may be multiplied, amplified or attenuated by a second different gain prior to being digitised by the (second) digitiser.

The (first) digitiser may be configured to digitise a first part of the first signal to produce the first digitised signal;

the ion detection system may further comprise a (third) digitiser configured to digitise a second part of the first signal to produce a third digitised signal; and the first part of the first signal may be multiplied, amplified or attenuated by a first gain prior to be being digitised by the (first) digitiser, and the second part of the first signal may be multiplied, amplified or attenuated by a third different gain prior to be being digitised by the (third) digitiser.

The ion detection system may comprise a splitter or divider configured to split or divide the first signal into the first part of the first signal and the second part of the first signal.

The ion detection system of may comprise:

a third output device configured to output a third signal in response to third secondary electrons produced by the one or more first devices; and a (further) digitiser configured to digitise the third signal to produce a third digitised signal.

The ion detection system of may comprise:

processing circuitry configured to determine third intensity and arrival time, mass or mass to charge ratio data from the third digitised signal; and processing circuitry configured to combine the third intensity and arrival time, mass or mass to charge ratio data and the first and second intensity and arrival time, mass or mass to charge ratio data to form the combined data set.

The ion detection system may be configured to produce the first digitised signal in response to ions incident at the first ion collection region with a first efficiency or gain.

The ion detection system may be configured to produce the second digitised signal in response to ions incident at the second ion collection region with a second different efficiency or gain.

The ion detection system may be configured to produce the first signal using a first number of stages or devices in series.

The ion detection system may be configured to produce the second signal using a second different number of stages or devices in series.

Each of the stages or devices may comprise an ion-to-electron device, an electron multiplier or electron to electron device, a micro-channel plate ("MCP") device, an electron to photon device, or a photon to electron device.

The ion detection system may be configured to produce the first signal using a first bias voltage.

The ion detection system may be configured to produce the second signal using a second different bias voltage.

The one or more first devices may comprise a first micro-channel plate ("MCP") device and a second micro-channel plate ("MCP") device.

The ion detection system may be configured to apply a first bias voltage to the first micro-channel plate ("MCP") device.

The ion detection system may be configured to apply a second different bias voltage to the second micro-channel plate ("MCP") device.

The one or more first devices may comprise a micro-channel plate ("MCP") device.

The ion detection system may be configured to apply a first bias voltage to a first region of the micro-channel plate ("MCP") device that corresponds to the first ion collection region.

The ion detection system may be configured to apply a second different bias voltage to a second different region of the micro-channel plate ("MCP") device that corresponds to the second ion collection region.

The one or more first devices may comprise a single micro-channel plate ("MCP") device.

The ion detection system may be configured to apply a first bias voltage to a first region of the single micro-channel plate ("MCP") device that corresponds to the first ion collection region.

The ion detection system may be configured to apply a second different bias voltage to a second different region of the single micro-channel plate ("MCP") device that corresponds to the second ion collection region.

According to an aspect there is provided an ion detection system comprising:

a micro-channel plate ("MCP") device comprising a first region and a second different region, wherein the micro-channel plate ("MCP") device is configured to produce first secondary electrons in response to one or more ions or electrons incident at the first region and to produce second secondary electrons in response to one or more ions or electrons incident at the second region;

a device configured to apply a first bias voltage to the first region of the micro-channel plate ("MCP") device; and a device configured to apply a second different bias voltage to the second different region of the micro-channel plate ("MCP") device.

The ion detection system may comprise a first photodiode or photomultiplier device, wherein the first output device may comprise the first photodiode or photomultiplier device, or the first photodiode or photomultiplier may be coupled to or include the first output device, e.g. the first electrode.

The ion detection system may comprise a second photodiode or photomultiplier device, wherein the second output device may comprise the second photodiode or photomultiplier device, or the second photodiode or photomultiplier may be coupled to or include the second output device, e.g. the second electrode.

According to an aspect there is provided an ion detection system comprising:

one or more micro-channel plate ("MCP") devices configured to produce secondary electrons in response to one or more incident ions or in response to one or more incident electrons; and one or more photodiode or photomultiplier devices configured to output one or more signals in response to secondary electrons produced by the one or more micro-channel plate ("MCP") devices.

The one or more first devices may comprise one or more micro-channel plate ("MCP") devices configured to produce secondary electrons in response to incident ions; and the first and/or second photodiode or photomultiplier device may be arranged to receive the secondary electrons produced by the one or more micro-channel plate ("MCP") devices in response to incident ions.

The ion detection system may comprise one or more devices configured to produce photons in response to electrons produced by the ion detection system in response to ions incident at the first and/or second ion collection regions.

The one or more first devices may comprise one or more micro-channel plate ("MCP") devices configured to produce secondary electrons in response to incident ions; and the one or more devices may be configured to produce photons in response to electrons are arranged to receive the secondary electrons produced by the one or more micro-channel plate ("MCP") devices in response to incident ions.

The ion detection system may comprise one or more electron focusing or defocusing devices configured to focus or defocus electrons produced by the ion detection system in response to ions incident at the first and/or second ion collection regions.

The ion detection system may comprise one or more electron focusing devices configured to focus electrons produced by the ion detection system in response to ions incident at the first and/or second ion collection regions.

The one or more electron focusing devices may be configured to focus electrons onto the first and/or second output device.

The ion detection system may comprise one or more devices configured to produce photons in response to electrons produced by the ion detection system in response to ions incident at the first and/or second ion collection regions.

The ion detection system may comprise one or more focusing or defocusing devices configured to focus or defocus light or photons produced by the ion detection system in response to ions incident at the first and/or second ion collection regions.

The ion detection system may comprise one or more focusing or defocusing devices configured to focus or defocus the photons produced by the ion detection system in response to ions incident at the first and/or second ion collection regions.

The one or more focusing or defocusing devices may be configured to focus photons onto the first and/or second output device.

The ion detection system may comprise one or more devices configured to produce electrons in response to photons produced by the ion detection system in response to ions incident at the first and/or second ion collection regions.

The ion detection system may comprise one or more devices configured to produce electrons in response to the photons produced by the ion detection system in response to ions incident at the first and/or second ion collection regions.

The ion detection system may be configured to accelerate the electrons produced in response to the photons.

The one or more focusing or defocusing devices may be configured to focus photons onto the one or more devices configured to produce electrons in response to photons.

The one or more first devices may be configured to produce first secondary electrons in response to one or more ions incident at the first ion collection region with a first ion to electron conversion efficiency or gain.

The one or more first devices may be configured to produce second secondary electrons in response to one or more ions incident at the second ion collection region with a second different ion to electron conversion efficiency or gain.

The one or more first devices may be configured to produce first secondary electrons in response to one or more ions incident at the first ion collection region with a first ion to electron conversion efficiency.

The one or more first devices may be configured to produce second secondary electrons in response to one or more ions incident at the second ion collection region with a second different ion to electron conversion efficiency.

According to an aspect there is provided an ion detection system comprising:

one or more first devices configured to produce secondary electrons in response to incident ions, the one or more first devices comprising a first ion collection region and a second ion collection region, wherein the one or more first devices are configured to produce first secondary electrons in response to one or more ions incident at the first ion collection region and to produce second secondary electrons in response to one or more ions incident at the second ion collection region;

wherein the one or more first devices are configured to produce first secondary electrons in response to one or more ions incident at the first ion collection region with a first ion to electron conversion efficiency or gain; and wherein the one or more first devices are configured to produce second secondary electrons in response to one or more ions incident at the second ion collection region with a second different ion to electron conversion efficiency or gain.

The one or more first devices may comprise a first region that comprises or corresponds to the first ion collection region and that comprises a first material or coating.

The one or more first devices may comprise a second different region that comprises or corresponds to the second ion collection region and that comprises a second different material or coating.

The ion detection system may be configured such that ions are incident at the first ion collection region with a first ion arrival rate.

The ion detection system may be configured such that ions are incident at the second ion collection region with a second different ion arrival rate.

The ion detection system may comprise one or more masks or grids upstream of the one or more first devices.

The ion detection system may comprise one or more devices configured to cause ions that pass through the mask or grid to spread out, defocus or diverge between the mask or grid and the one or more first devices.

The one or more masks or grids may be configured such that ions are incident at the first ion collection region with a first ion arrival rate and such that ions are incident at the second ion collection region with a second different ion arrival rate.

According to an aspect there is provided an ion detection system comprising:

one or more first devices configured to produce secondary electrons in response to incident ions, the one or more first devices comprising a first ion collection region and a second ion collection region, wherein the one or more first devices are configured to produce first secondary electrons in response to one or more ions incident at the first ion collection region and to produce second secondary electrons in response to one or more ions incident at the second ion collection region;

one or more masks or grids upstream of the one or more first devices; and one or more devices configured to cause ions that pass through the mask or grid to spread out, defocus or diverge between the mask or grid and the one or more first devices.

The first output device may be configured to output a first signal in response only to first secondary electrons produced by the one or more first devices and the second output device may be configured to output a second signal in response only to second secondary electrons produced by the one or more first devices.

The first output device may be configured to output a first signal in response to first secondary electrons produced by the one or more first devices and in response to second secondary electrons produced by the one or more first devices, and the second output device may be configured to output a second signal in response to second secondary electrons produced by the one or more first devices and in response to first secondary electrons produced by the one or more first devices.

According to an aspect there is provided an ion detection system comprising:

one or more first devices configured to produce secondary electrons in response to incident ions;

a first output device configured to output a first signal in response to secondary electrons produced by the one or more first devices; and a second output device configured to output a second signal in response to secondary electrons produced by the one or more first devices;

wherein the ion detection system is configured such that both the first output device outputs a first signal and the second output device outputs a second signal in response to each ion incident at one or more ion collection regions of the one or more first devices.

According to an aspect there is provided an analytical instrument comprising the ion detection system described above. The analytical instrument may comprise a mass and/or ion mobility spectrometer.

According to an aspect there is provided a method of detecting ions comprising using the ion detection system described above to detect ions.

According to an aspect there is provided a method of detecting ions comprising:

producing first secondary electrons from one or more first devices in response to one or more ions incident at a first ion collection region of the one or more first devices;

producing second secondary electrons from the one or more first devices in response to one or more ions incident at a second ion collection region of the one or more first devices;

outputting a first signal from a first output device in response to first secondary electrons produced by the one or more first devices; and outputting a second signal from a second output device in response to second secondary electrons produced by the one or more first devices.

The method may comprise:

digitising the first signal to produce a first digitised signal;

digitising the second signal to produce a second digitised signal;

determining first intensity and arrival time, mass or mass to charge ratio data from the first digitised signal;

determining second intensity and arrival time, mass or mass to charge ratio data from the second digitised signal; and combining the first intensity and arrival time, mass or mass to charge ratio data and the second intensity and arrival time, mass or mass to charge ratio data to form a combined data set.

The first output device and/or the first ion collection region may have a first effective area, and the second output device and/or the first ion collection region may have a second different effective area.

The one or more first devices may comprise one or more inactive regions.

The one or more inactive regions may be arranged to prevent the first output device outputting a first signal and the second output device outputting a second signal in response to a single ion incident at the one or more first devices.

According to an aspect there is provided a method of detecting ions comprising:

producing first secondary electrons in response to one or more ions or electrons incident at a first active region of one or more micro-channel plate ("MCP") devices;

producing second secondary electrons in response to one or more ions or electrons incident at a second active region of the one or more micro-channel plate ("MCP") devices;

outputting a first signal from a first output device in response to first secondary electrons produced by the one or more micro-channel plate ("MCP") devices; and outputting a second signal from a second output device in response to second secondary electrons produced by the one or more micro-channel plate ("MCP") devices;

wherein the one or more micro-channel plate ("MCP") devices comprises one or more inactive regions that are arranged to prevent the first output device outputting a first signal and the second output device outputting a second signal in response to a single ion or a single electron incident at the one or more micro-channel plate ("MCP") devices.

The one or more first devices may comprise a micro-channel plate ("MCP") device comprising a first active region, a second different active, and one or more inactive regions; and the one or more inactive regions may be arranged between the first active region and the second active region so as to prevent the first output device outputting a first signal and the second output device outputting a second signal in response to a single ion incident at the one or more first devices.

The first signal may be multiplied, amplified or attenuated by a first gain prior to being digitised, and the second signal may be multiplied, amplified or attenuated by a second different gain prior to being digitised.

The method may comprise:

digitising a first part of the first signal to produce the first digitised signal; and digitising a second part of the first signal to produce a third digitised signal;

wherein the first part of the first signal may be multiplied, amplified or attenuated by a first gain prior to being digitised, and the second part of the first signal may be multiplied, amplified or attenuated by a third different gain prior to being digitised.

The method may comprise:

outputting a third signal from a third output device in response to third secondary electrons produced by the one or more first devices; and digitising the third signal to produce a third digitised signal.

The method may comprise:

determining third intensity and arrival time, mass or mass to charge ratio data from the third digitised signal; and combining the third intensity and arrival time, mass or mass to charge ratio data and the first and second intensity and arrival time, mass or mass to charge ratio data to form the combined data set.

The method may comprise splitting or dividing the first signal into the first part of the first signal and the second part of the first signal.

The method may comprise producing the first digitised signal in response to ions incident at the first ion collection region with a first efficiency or gain.

The method may comprise producing the second digitised signal in response to ions incident at the second ion collection region with a second different efficiency or gain.

The method may comprise producing the first signal using a first number of stages or devices in series.

The method may comprise producing the second signal using a second different number of stages or devices in series.

Each of the stages or devices may comprise an ion-to-electron device, an electron multiplier or electron to electron device, a micro-channel plate ("MCP") device, an electron to photon device, or a photon to electron device.

The method may comprise producing the first signal using a first bias voltage.

The method may comprise producing the second signal using a second different bias voltage.

The one or more first devices may comprise a first micro-channel plate ("MCP") device and a second micro-channel plate ("MCP") device.

The method may comprise applying a first bias voltage to the first micro-channel plate ("MCP") device.

The method may comprise applying a second different bias voltage to the second micro-channel plate ("MCP") device.

The one or more first devices may comprise a micro-channel plate ("MCP") device.

The method may comprise applying a first bias voltage to a first region of the micro-channel plate ("MCP") device that corresponds to the first ion collection region.

The method may comprise applying a second different bias voltage to a second different region of the micro-channel plate ("MCP") device that corresponds to the second ion collection region.

The one or more first devices may comprise a single micro-channel plate ("MCP") device.

The method may comprise applying a first bias voltage to a first region of the single micro-channel plate ("MCP") device that corresponds to the first ion collection region.

The method may comprise applying a second different bias voltage to a second different region of the single micro-channel plate ("MCP") device that corresponds to the second ion collection region.

According to an aspect there is provided a method of detecting ions comprising:

applying a first bias voltage to a first region of a micro-channel plate ("MCP") device;

applying a second different bias voltage to a second different region of the micro-channel plate ("MCP") device;

producing first secondary electrons in response to one or more ions or electrons incident at the first region of the micro-channel plate ("MCP") device; and producing second secondary electrons in response to one or more ions or electrons incident at the second different region of the micro-channel plate ("MCP") device.

The method may comprise providing a first photodiode or photomultiplier device, wherein the first output device may comprise the first photodiode or photomultiplier device, or the first photodiode or photomultiplier may be coupled to or include the first output device, e.g. the first electrode.

The method may comprise providing a second photodiode or photomultiplier device, wherein the second output device may comprise the second photodiode or photomultiplier device, or the second photodiode or photomultiplier may be coupled to or include the second output device, e.g. the second electrode.

According to an aspect there is provided a method of detecting ions comprising:

producing secondary electrons from one or more micro-channel plate ("MCP") devices in response to one or more incident ions or in response to one or more incident electrons; and outputting one or more signals from one or more photodiode or photomultiplier devices in response to secondary electrons produced by the one or more micro-channel plate ("MCP") devices.

The method may comprise one or more micro-channel plate ("MCP") devices producing secondary electrons in response to incident ions; and the first and/or second photodiode or photomultiplier device receiving the secondary electrons produced by the one or more micro-channel plate ("MCP") devices in response to incident ions.

The method may comprise producing photons in response to electrons produced by the ion detection system in response to ions incident at the first and/or second ion collection regions.

The method may comprise one or more micro-channel plate ("MCP") devices producing secondary electrons in response to incident ions; and the one or more devices that are configured to produce photons in response to electrons receiving the secondary electrons produced by the one or more micro-channel plate ("MCP") devices in response to incident ions.

The method may comprise focusing or defocusing electrons produced in response to ions incident at the first and/or second ion collection regions.

The method may comprise focusing electrons produced in response to ions incident at the first and/or second ion collection regions.

The method may comprise focusing electrons onto the first and/or second output device.

The method may comprise producing photons in response to electrons produced in response to ions incident at the first and/or second ion collection regions.

The method may comprise producing electrons in response to the photons produced in response to ions incident at the first and/or second ion collection regions.

The method may comprise accelerating the electrons produced in response to the photons.

The method may comprise focusing or defocusing light or photons produced in response to ions incident at the first and/or second ion collection regions.

The method may comprise focusing photons onto the one or more devices that are configured to produce electrons in response to photons.

The method may comprise producing electrons in response to photons produced in response to ions incident at the first and/or second ion collection regions.

The method may comprise the one or more first devices producing first secondary electrons in response to one or more ions incident at the first ion collection region with a first ion to electron conversion efficiency or gain.

The method may comprise the one or more first devices producing second secondary electrons in response to one or more ions incident at the second ion collection region with a second different ion to electron conversion efficiency or gain.

The method may comprise producing first secondary electrons in response to one or more ions incident at the first ion collection region with a first ion to electron conversion efficiency.

The method may comprise producing second secondary electrons in response to one or more ions incident at the second ion collection region with a second different ion to electron conversion efficiency.

According to an aspect there is provided a method of detecting ions comprising:

producing first secondary electrons in response to one or more ions incident at a first ion collection region of one or more first devices with a first ion to electron conversion efficiency or gain; and producing second secondary electrons in response to one or more ions incident at a second ion collection region of the one or more first devices with a second different ion to electron conversion efficiency or gain.

The one or more first devices may comprise a first region that comprises or corresponds to the first ion collection region and that comprises a first material or coating.

The one or more first devices may comprise a second different region that comprises or corresponds to the second ion collection region and that comprises a second different material or coating.

The method may comprise causing ions to be incident at the first ion collection region with a first ion arrival rate.

The method may comprise causing ions to be incident at the second ion collection region with a second different ion arrival rate.

The method may comprise providing one or more masks or grids upstream of the one or more first devices.

The method may comprise causing ions that pass through the mask or grid to spread out, defocus or diverge between the mask or grid and the one or more first devices.

The one or more masks or grids may be configured such that ions are incident at the first ion collection region with a first ion arrival rate and such that ions are incident at the second ion collection region with a second different ion arrival rate.

According to an aspect there is provided a method of detecting ions comprising:

providing one or more masks or grids upstream of one or more first devices;

causing ions that pass through the mask or grid to spread out, defocus or diverge between the mask or grid and the one or more first devices;

producing first secondary electrons from the one or more first devices in response to one or more ions incident at a first ion collection region of the one or more first devices; and producing second secondary electrons from the one or more first devices in response to one or more ions incident at a second ion collection region of the one or more first devices.

The method may comprise the first output device outputting a first signal in response only to first secondary electrons produced by the one or more first devices and the second output device outputting a second signal in response only to second secondary electrons produced by the one or more first devices.

The method may comprise the first output device outputting a first signal in response to first secondary electrons produced by the one or more first devices and in response to second secondary electrons produced by the one or more first devices, and the second output device outputting a second signal in response to second secondary electrons produced by the one or more first devices and in response to first secondary electrons produced by the one or more first devices.

According to an aspect there is provided a method of detecting ions comprising:

producing secondary electrons in response to ions incident on one or more first devices;

outputting a first signal from a first output device in response to secondary electrons produced by the one or more first devices; and outputting a second signal from a second output device in response to secondary electrons produced by the one or more first devices;

wherein the method further comprises both outputting a first signal from the first output device and outputting a second signal from the second output device in response to each ion incident at one or more ion collection regions of the one or more first devices.

According to an aspect there is provided a method of mass and/or ion mobility spectrometry comprising the method of detecting ions described above.

According to an aspect there is provided a method of mass spectrometry comprising:

pulsing ions into a time of flight separation region and providing an ion detector, wherein the ion detector is configured to produce secondary electrons in response to incident ions;

providing a first collection electrode and a second collection electrode, wherein the first collection electrode is configured to receive secondary electrons in response to a different population of incident ions than the second collection electrode for a given average ion arrival rate at the detector input;

outputting a first signal and a second signal from the first and second collection electrodes;

digitising the first signal to produce a first digitised signal and digitising the second signal to produce a second digitised signal;

determining first intensity and arrival time, mass or mass to charge ratio data from the first digitised signal;

determining second intensity and arrival time, mass or mass to charge ratio data from the second digitised signal; and combining the first intensity and arrival time, mass or mass to charge ratio data and the second intensity and arrival time, mass or mass to charge ratio data to form a combined data set.

The anodes may have different sizes.

The first collection electrode may have a larger effective area or larger physical area than the second collection electrode.

A dual gain ADC may be provided on one or both anodes.

The method may comprise outputting a first signal and a second signal from the first collection electrode and/or a third and fourth signal from the second collection electrode, wherein the first, second, third, and fourth signals respectively correspond to the first signal multiplied or amplified by a first gain, the first signal multiplied or amplified by a second different gain, the third signal multiplied or amplified by a third gain, and the fourth signal multiplied or amplified by a fourth different gain, and scaling the intensity of the signal or signals from the first and second collection electrodes by one or more scaling factors.

The detectors may have different gains.

The first collection electrode may receive secondary electrons from a first electron multiplier configuration in response to the arrival of first incident ions, and the second collection electrode may receive second secondary electrons from a second electron multiplier configuration in response to the arrival of second incident ions, and the gain or primary ion to electron efficiency or yield may be different for the first and second electron multiplier configuration.

BRIEF DESCRIPTION OF THE DRAWINGS

Various embodiments will now be described, by way of example only, and with reference to the accompanying drawings in which.

DETAILED DESCRIPTION

Figure 1:
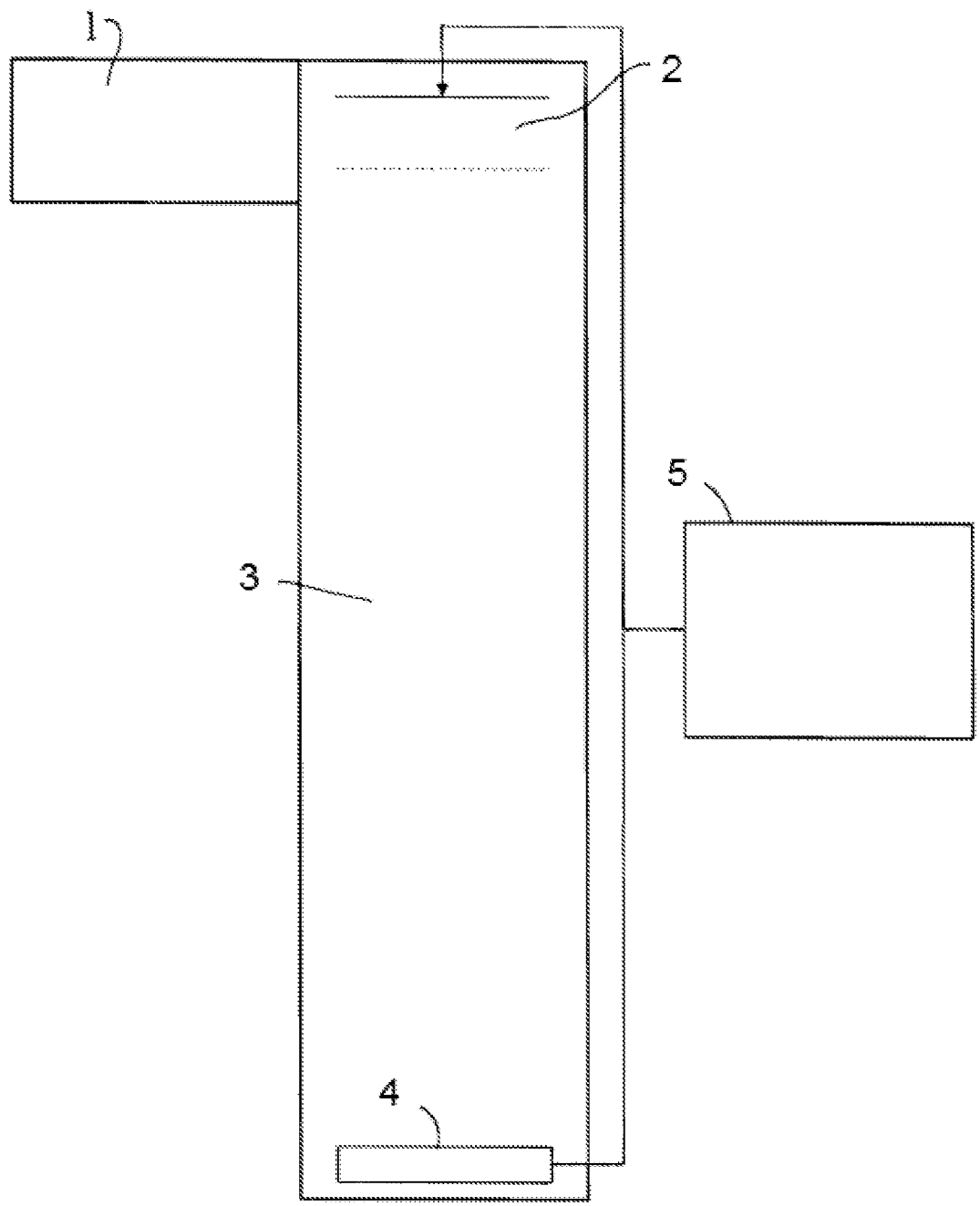
FIG. 1 shows schematically a Time of Flight ("ToF") mass spectrometer in accordance with various embodiments.

FIG. 1 shows a Time of Flight ("ToF") mass spectrometer according to various embodiments comprising one or more upstream stages 1, an acceleration region 2, a field free or drift region 3, an ion detector 4 arranged at the exit region of the field free or drift region 4, and a control system 5.

The one or more upstream stages may include any one or more of: (i) an ion source; (ii) one or more ion guides; (iii) a mass or mass to charge ratio separator or filter; (iv) one or more ion mobility separation devices; (v) one or more Field Asymmetric Ion Mobility Spectrometer devices; (vi) one or more ion traps or one or more ion trapping regions; (vii) one or more collision, fragmentation or reaction cells; (viii) a device or ion gate for pulsing ions; (ix) a device for converting a substantially continuous ion beam into a pulsed ion beam; and (x) a chromatography or other separation device.

The ion source may be selected from the group consisting of: (i) an Electrospray ionisation ("ESI") ion source; (ii) an Atmospheric Pressure Photo Ionisation ("APPI") ion source; (iii) an Atmospheric Pressure Chemical Ionisation ("APCI") ion source; (iv) a Matrix Assisted Laser Desorption Ionisation ("MALDI") ion source; (v) a Laser Desorption Ionisation ("LDI") ion source; (vi) an Atmospheric Pressure Ionisation ("API") ion source; (vii) a Desorption Ionisation on Silicon ("DIOS") ion source; (viii) an Electron Impact ("EI") ion source; (ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; (xx) a Glow Discharge ("GD") ion source; (xxi) an Impactor ion source; (xxii) a Direct Analysis in Real Time ("DART") ion source; (xxiii) a Laserspray Ionisation ("LSI") ion source; (xxiv) a Sonicspray Ionisation ("SSI") ion source; (xxv) a Matrix Assisted Inlet Ionisation ("MAII") ion source; (xxvi) a Solvent Assisted Inlet Ionisation ("SAII") ion source; (xxvii) a Desorption Electrospray Ionisation ("DESI") ion source; (xxviii) a Laser Ablation Electrospray Ionisation ("LAESI") ion source; and (xxix) Surface Assisted Laser Desorption Ionisation ("SALDI").

The mass filter may be selected from the group consisting of: (i) a quadrupole mass filter; (ii) a 2D or linear quadrupole ion trap; (iii) a Paul or 3D quadrupole ion trap; (iv) a Penning ion trap; (v) an ion trap; (vi) a magnetic sector mass filter; (vii) a Time of Flight mass filter; and (viii) a Wien filter.

The chromatography or other separation device may be upstream of the ion source, and may comprise a liquid chromatography or gas chromatography device. Alternatively, the separation device may comprise: (i) a Capillary Electrophoresis ("CE") separation device; (ii) a Capillary Electrochromatography ("CEC") separation device; (iii) a substantially rigid ceramic-based multilayer microfluidic substrate ("ceramic tile") separation device; or (iv) a supercritical fluid chromatography separation device.

The spectrometer may be operated in various modes of operation including a mass spectrometry ("MS") mode of operation; a tandem mass spectrometry ("MS/MS") mode of operation; a mode of operation in which parent or precursor ions are alternatively fragmented or reacted so as to produce fragment or product ions, and not fragmented or reacted or fragmented or reacted to a lesser degree; a Multiple Reaction Monitoring ("MRM") mode of operation; a Data Dependent Analysis ("DDA") mode of operation; a Data Independent Analysis ("DIA") mode of operation; a Quantification mode of operation; and/or an Ion Mobility Spectrometry ("IMS") mode of operation.

Ions formed in the one or more upstream stages 1 of the mass spectrometer are arranged to enter the acceleration region 2 where they are driven by an acceleration pulse applied to an acceleration electrode into the field free or drift region 3. It should be noted here that FIG. 1 is merely schematic, and that other Time of Flight ("ToF") mass spectrometer arrangements, such as a reflectron arrangement, may be used.

The ions are accelerated to a velocity determined by the energy imparted by the acceleration pulse and the mass or mass to charge ratio of the ions. Ions having a relatively low mass to charge ratio achieve a relatively high velocity and reach the ion detector 4 prior to ions having a relatively high mass to charge ratio.

Thus, ions arrive at the ion detector 4 after a time determined by their velocity and the distance travelled which enables the mass or mass to charge ratio of the ions to be determined. Each ion or groups of ions arriving at the detector 4 is sampled by the detector 4, and the control system 5 determines a value indicative of the time of flight and/or mass-to-charge ratio ("m/z") of the ion or group of ions. Data for multiple ions may be collected and combined to generate a Time of Flight ("ToF") spectrum and/or a mass spectrum.

According to various embodiments, for each ion or group of ions arriving at the detector 4, the detector 4 will produce one or more signals, which may then be digitised, e.g. by processing circuitry in the control system 5, and converted into time-intensity pairs, i.e. data values comprising a time-of-flight value together with an intensity value. In these embodiments, multiple such time-intensity pairs may be collected and combined to generate a Time of Flight ("ToF") spectrum and/or a mass spectrum.

The control system 5 may be configured to control the operation of the spectrometer, e.g. in the manner of the various embodiments described herein. The control system 5 may comprise suitable control circuitry that is configured to cause the spectrometer to operate in the manner of the various embodiments described herein. The control system 5 may also comprise suitable processing circuitry configured to perform any one or more or all of the necessary processing and/or post-processing operations in respect of the various embodiments described herein.

According to various embodiments, the ion detector 4 comprises one or more first devices 11 configured to produce secondary electrons in response to incident ions, where the one or more first devices 11 comprise a first ion collection region and a second ion collection region, and is or are configured to produce first secondary electrons in response to one or more ions incident at the first ion collection region and to produce second secondary electrons in response to one or more ions incident at the second ion collection region.

The one or more first devices 11 may comprise any suitable device or devices that is or are configured to produce secondary electrons in response to incident ions. The one or more first devices 11 may be configured to produce a cloud of secondary electrons in response to an incident ion. The one or more first devices 11 may comprise one or more ion detector devices, e.g. one or more ion-to-electron devices, such as one or more continuous or discrete dynode detectors and/or one or more micro-channel plate ("MCP") devices. Each of the first devices 11 may comprise a single ion-to-electron device (e.g. a single MCP plate) or plural stages or devices (e.g. plural MCP plates) in series.

Any number of first devices may be provided, such as one, two, three or more first (ion-to-electron) devices (e.g. MCP plates). Where the ion detection system comprises plural first devices (e.g. plural MCP plates), the plural first devices may be arranged in a plane, e.g. adjacent to one another, or in plural different (parallel) planes, e.g. in an overlapping or non-overlapping manner.

The one or more first devices 11 comprise a first ion collection region and a second ion collection region and is or are configured to produce first secondary electrons in response to one or more ions incident at the first ion collection region and to produce second secondary electrons in response to one or more ions incident at the second ion collection region. The one or more first devices 11 may further comprise one or more further ion collection regions and may be configured to produce further secondary electrons in response to one or more ions incident at the one or more further ion collection regions.

The division of the one or more first devices into plural ion collection regions may be done in any suitable manner. Where the one or more first devices 11 comprise a single ion-to-electron device (e.g. a single MCP plate), then one part (e.g. of the (front) surface area) of the device may serve as the first ion collection region and a second different part (e.g. of the (front) surface area) of the device may serve as the second ion collection region. Where the one or more first devices 11 comprise plural ion-to-electron devices (e.g. plural MCP plates), then one of the devices may serve as the first ion collection region and a second different device may serve as the second ion collection region. In this case, it would also be possible for one or more or each of the plural ion-to-electron devices to be further divided into different ion collection regions.

Each of the first and second (and optionally further) ion collection regions may have any suitable effective area, i.e. area over which incident ions will give rise to secondary electrons. The first and second (and optionally further) effective areas of the first and second (and optionally further) ion collection regions may be the same area or may be different areas.

Each of the first and second (and optionally further) ion collection regions may have any suitable ion-to-electron conversion efficiency or gain. The first and second (and optionally further) ion-to-electron conversion efficiencies or gains of the first and second (and optionally further) ion collection regions may be the same or may be different.

The first and second (and optionally further) ion collection regions may be provided with different ion-to-electron conversion efficiencies or gains in any suitable manner. In various embodiments: (i) the one or more first devices corresponding to the first and second ion collection regions may comprise different numbers of ion-to-electron and electron multiplication or electron-to-electron devices (e.g. different numbers of MCP plates) in series; (ii) the first and second ion collection regions may comprise different materials or coatings, e.g. that have different ion transmission and/or electron emissive properties; (iii) the first and second ion collection regions may comprise MCP plates having different densities of active micro-channels; and/or (iv) the first and second ion collection regions may be biased using different bias voltages.

In this latter embodiment, where the one or more first devices 11 comprise plural devices (e.g. plural MCP plates) and one of the first devices serves as the first ion collection region and another of the first devices serves as the second ion collection region, the different first devices may receive different bias voltages, e.g. from independent voltage sources or otherwise.

Where the one or more first devices 11 corresponding to the first and second ion collection regions comprise different numbers of ion-to-electron and electron multiplication or electron-to-electron devices (e.g. different numbers of MCP plates) in series, the different devices (e.g. the different MCP plates) may each receive a bias voltage from a respective independent voltage source or otherwise. In this regard, the Applicants have recognised that in these arrangements, the devices (MCP plates) may age at different rates. This is because one or more of the devices (MCP plates) may produce more electrons than one or more other of the devices (MCP plates). Independent control of the bias voltages applied to each device (MCP plate) in this manner allows the gains of the devices (MCP plates) to be independently adjusted, e.g. so as to maintain the desired gain ratio between the devices (MCP plates) while the devices (MCP plates) age at different rates.

Where the one or more first devices 11 comprise a single device (e.g. a single MCP plate or MCP plate pair, etc.) and one part of the device serves as the first ion collection region and another different part of the device serves as the second ion collection region, the different regions of the single device may receive different bias voltages. In this embodiment, the different regions should be electrically isolated from one another. This may be achieved as desired, e.g. by providing the device (e.g. MCP plate) with one or more inactive (non-active) regions 24, e.g. that are configured to be electrically insulating, between the first and second (and optionally further) (active) ion collection regions.

The ion detection system comprises a first output device, e.g. comprising a first electrode 14, configured to output a first signal in response to first secondary electrons produced by the one or more first devices 11, and a second output device, e.g. comprising a second electrode 15, configured to output a second signal in response to second secondary electrons produced by the one or more first devices 11. Accordingly, when first secondary electrons are produced by the one or more first devices 11 due to one or more ions incident at the first ion collection region, then the first output device, e.g. the first electrode 14, may output a corresponding signal. When second secondary electrons are produced by the one or more first devices 11 due to one or more ions incident at the second ion collection region, then the second output device, e.g. the second electrode 15, may output a corresponding signal.

This arrangement, where secondary electrons are produced due to ions arriving at different ion collection regions that give rise to different signals via different output devices, facilitates an increased dynamic range ion detection system, e.g. that does not suffer from problems associated with splitting the output from a single collection electrode between multiple digitisers (e.g. problems associated with saturation of the input for one of the amplifiers affecting the input conditions for the other amplifier(s), and problems associated with increasing the gain of the ion-to-electron (electron multiplier) device).

The ion detection system may comprise one or more further output devices, e.g. one or more further electrodes, each of which may be configured in a corresponding manner to the first 14 and/or second 15 output devices, e.g. to output a signal in response to (further) secondary electrons produced by the one or more first devices 11.

Each of the first 14 and second 15 output devices may comprise any suitable type of output device, such as an electrode (e.g. anode), that is configured to output a signal (e.g. voltage). The first 14 and second 15 (and optionally further) output devices, e.g. electrodes, may be arranged in a (single) plane, e.g. adjacent to one another, or in plural different (parallel) planes.

The first 14 and/or second 15 (and optionally further) output devices may be configured to output their respective signals in response to secondary electrons produced by the one or more first devices 11 in any suitable manner.

According to various embodiments, one or each of the first 14 and second 15 (and optionally further) output devices may comprise a collection electrode (anode) that is arranged to (directly) receive secondary electrons produced by the one or more first devices 11, and may be configured to output a signal in response to received secondary electrons. That is, the first electrode 14 may be arranged (located) such that it receives at least some of the first secondary electrons produced by the one or more first devices 11 (in response to ions incident at the first ion collection region) and/or the second electrode 15 may be arranged (located) such that it receives at least some of the second secondary electrons produced by the one or more first devices 11 (in response to ions incident at the second ion collection region). Where present, each further electrode may be arranged (located) such that it receives at least some further secondary electrons produced by the one or more first devices 11 (in response to ions incident at a further ion collection region).

According to various further embodiments, one or more or each of the output devices, e.g. electrodes, is not (is other than) arranged to (directly) receive secondary electrons produced by the one or more first devices 11, but will nevertheless produce an output signal in response to secondary electrons produced by the one or more first devices 11.

For example, the ion detection system may comprise one or more second devices 12 configured to produce output electrons in response to incident electrons, wherein the one or more second devices 12 may be arranged so as to receive at least some of the secondary electrons produced by the one or more first devices 11. The one or more second devices 12 may be configured to amplify received electrons, i.e. the one or more second devices may be configured to produce an increased number of output electrons in response to incident electrons.

The one or more second devices 12 may comprise any suitable device or devices that is or are configured to produce output electrons in response to incident electrons. The one or more second devices 12 may comprise one or more electron-to-electron or electron multiplier devices, such as one or more micro-channel plate ("MCP") devices. Each of the second devices 12 may comprise a single electron multiplier device (e.g. a single MCP plate) or plural electron multiplier devices in series (e.g. plural MCP plates in series).

Any number of second devices may be provided, such as one, two, three or more second (electron multiplier) devices (e.g. MCP plates). Where the ion detection system comprises plural second devices (e.g. plural MCP plates), the plural second devices may be arranged in a plane, e.g. adjacent to one another, or in plural different (parallel) planes, e.g. in an overlapping or non-overlapping manner.

The one or more second devices 12 may comprise a first electron collection region and/or a second electron collection region and may be configured to produce first output electrons in response to one or more electrons incident at the first electron collection region and/or to produce second output electrons in response to one or more electrons incident at the second electron collection region. The one or more second devices 12 may further comprise one or more further electron collection regions and may be configured to produce further secondary electrons in response to one or more electrons incident at the one or more further electron collection regions.

The first electron collection region may be arranged (located) such that it receives at least some of the first secondary electrons produced by the one or more first devices 11 (in response to ions incident at the first ion collection region) and/or the second electron collection region may be arranged (located) such that it receives at least some of the second secondary electrons produced by the one or more first devices 11 (in response to ions incident at the second ion collection region). Where present, each further electron collection region may be arranged (located) such that it receives at least some of the further secondary electrons produced by the one or more first devices 11 (in response to the ions incident at a further ion collection region).

The division of the one or more second devices 12 into plural electron collection regions may be done in any suitable manner. Where the one or more second devices 12 comprises a single electron multiplier device (e.g. a single MCP plate), then one part (e.g. of the (front) surface area) of the device may serve as the first electron collection region and a second different part (e.g. of the (front) surface area) of the device may serve as the second electron collection region. Where the one or more second devices 12 comprise plural electron multiplier devices (e.g. plural MCP plates), then one of the devices may serve as the first electron collection region and a second different device may serve as the second electron collection region. In this case, it would also be possible for one or more or each of the plural electron multiplier devices to be further divided into different electron collection regions.

Each of the first and second (and optionally further) electron collection regions may have any suitable effective area, i.e. area over which incident electrons will give rise to output electrons. The first and second (and optionally further) effective areas may be the same area or may be different areas.

Each of the first and second (and optionally further) electron collection regions may have any suitable electron multiplication gain. The first and second (and optionally further) electron multiplication gains may be the same or may be different. The first and second (and optionally further) electron collection regions may be provided with different electron multiplication gains in any suitable manner, e.g. as described above with respect to the first device(s) (mutatis mutandi).

In these embodiments, one or each of the first 14 and second 15 (and optionally further) output devices may comprise a collection electrode (anode) that is arranged to (directly) receive output electrons produced by the one or more second devices 12, and may be configured to output a signal in response to received output electrons. That is, the first electrode 14 may be arranged (located) such that it receives at least some of the first output electrons produced by the one or more second devices 12 (in response to electrons incident at the first electron collection region (i.e. in response to ions incident at the first ion collection region)) and/or the second electrode 15 may be arranged (located) such that it receives at least some of the second output electrons produced by the one or more second devices 12 (in response to electrons incident at the second electron collection region (i.e. in response to ions incident at the second ion collection region)).

However, it would also be possible for one or more further electron multiplier devices (stages) to be provided between the one or more second devices 12 and the first 14 and second 15 (and optionally further) output devices, e.g. electrodes. The one or more further electron multiplier devices (stages) may be configured in a corresponding manner to the one or more second devices 12 (mutatis mutandi).

In the above embodiments, each of the first and second (and optionally further) output devices, e.g. each of the first 14 and second 15 (and optionally further) electrodes, may have any suitable effective area, i.e. area over which incident electrons will give rise to a signal. The first and second (and optionally further) effective areas may be the same area or may be different areas.

According to various embodiments, the ion detection system comprises a first photodiode or photomultiplier 20, and/or a second photodiode or photomultiplier 21. One or more further photodiodes or photomultipliers may also be provided.

Each of the photodiodes or photomultipliers may comprise any suitable device, such as a photodiode sensor, an avalanche photodiode detector ("APD") or a silicon photomultiplier ("SiPM").

The first output device may comprise the first photodiode or photomultiplier 20, or the first photodiode or photomultiplier 20 may be coupled to or may include the first output device, e.g. electrode 14, such that the first output device, e.g. electrode 14, outputs a signal in response to photons or electrons incident at the first photodiode or photomultiplier 20. Correspondingly, the second output device may comprise the second photodiode or photomultiplier 21, or the second photodiode or photomultiplier 21 may be coupled to or may include the second output device, e.g. electrode 15, such that the second output device, e.g. electrode 15, outputs a signal in response to photons or electrons incident at the second photodiode or photomultiplier 21. Where present, each of the one or more further output devices may comprise a further photodiode or photomultiplier, or each of the one or more further photodiodes or photomultipliers may be coupled to or include a further output device, e.g. electrode, such that the further output device, e.g. electrode, outputs a signal in response to photons or electrons incident at the further photodiode or photomultiplier.

Each of the first 20 and second 21 (and optionally further) photodiodes or photomultipliers may have any suitable effective area, i.e. area over which incident photons or electrons will give rise to a signal. The first and second (and optionally further) effective areas may be the same area or may be different areas.

Each of the first 20 and second 21 (and optionally further) photodiodes or photomultipliers may have any suitable detection efficiency or gain. The first and second (and optionally further) detection efficiencies or gains may be the same or may be different.

The first photodiode or photomultiplier 20 may be arranged (located) such that it receives at least some of the electrons produced by the one or more first 11 and/or second devices 12 in response to ions incident at the first ion collection region and/or the second photodiode or photomultiplier 21 may be arranged (located) such that it receives at least some of the electrons produced by the one or more first 11 and/or second 12 devices in response to ions incident at the second ion collection region. Where present, each further photodiode or photomultiplier may be arranged (located) such that it receives at least some of the electrons produced by the one or more first 11 and/or second 12 devices in response to ions incident at a further ion collection region.

According to various embodiments, the ion detection system may comprise one or more electron focusing or defocusing devices. The one or more electron focusing or defocusing devices may be configured to focus or defocus some or all of the electrons produced by the one or more first 11 and/or second 12 devices. In particular, the one or more electron focusing devices may be configured to focus electrons onto the first 14 and/or second 15 (and optionally further) electrodes, or onto the first 20 and/or second 21 (and optionally further) photodiode or photomultiplier devices. This can beneficially improve the detection efficiency of the ion detection system and/or can allow the size of the electrode(s) and/or photodiode or photomultiplier device(s) to be reduced. Reducing the size of the photodiode or photomultiplier device(s) can improve the response time characteristics of the device(s).

Each of the one or more electron focusing or defocusing devices may comprise any suitable such device, such as one or more electrostatic focusing or defocusing devices, lenses or electrodes, etc.

The degree to which the electrons are focussed or defocussed onto the first and second (and optionally further) electrodes or devices may be the same or may be different. The degree to which the electrons are focussed or defocussed onto one or more or each of the first and second (and optionally further) electrodes or devices may be fixed or may be variable.

According to various embodiments, the detection system may comprise one or more third devices 22 configured to produce output photons in response to incident electrons, wherein the one or more third devices 22 may be arranged so as to receive at least some of the electrons produced by the one or more first 11 and/or second 12 devices.

The one or more third devices 22 may comprise any suitable device or devices that is or are configured to produce output photons in response to incident electrons. The one or more third devices 22 may comprise one or more electron-to-photon devices, such as one or more scintillator or phosphor devices.

The one or more third devices 22 may comprise a first electron collection region and/or a second electron collection region and may be configured to produce first output photons in response to one or more electrons incident at the first electron collection region and/or to produce second output photons in response to one or more electrons incident at the second electron collection region. The one or more third devices 22 may further comprise one or more further electron collection regions and may be configured to produce further photons in response to one or more electrons incident at the one or more further electron collection regions.

The first electron collection region may be arranged (located) such that it receives at least some of the first electrons produced by the one or more first 11 and/or second 12 devices (in response to ions incident at the first ion collection region) and/or the second electron collection region may be arranged (located) such that it receives at least some of the second electrons produced by the one or more first 11 and/or second 12 devices (in response to ions incident at the second ion collection region). Where present each further electron collection region may be arranged (located) such that it receives at least some of the further electrons produced by the one or more first 11 and/or second 12 devices (in response to ions incident at a further ion collection region).

Each of the first and second (and optionally further) electron collection regions may have any suitable effective area, i.e. area over which incident electrons will give rise to photons. The first and second (and optionally further) effective areas may be the same area or may be different areas.

Each of the first and second (and optionally further) electron collection regions may have any suitable electron-to-photon conversion efficiency or gain. The first and second (and optionally further) electron-to-photon conversion efficiencies or gains may be the same or may be different.

In these embodiments, the first photodiode or photomultiplier 20 may be arranged (located) such that it receives at least some of the first photons produced by the one or more third devices 22 (in response to electrons incident at the first electron collection region of the third device(s) 22 (i.e. in response to ions incident at the first ion collection region)) and/or the second photodiode or photomultiplier 21 may be arranged (located) such that it receives at least some of the second photons produced by the one or more third devices 22 (in response to electrons incident at the second electron collection region of the third device(s) 22 (i.e. in response to ions incident at the second ion collection region)). Where present, each further photodiode or photomultiplier may be arranged (located) such that it receives at least some of the further photons produced by the one or more third devices 22 (in response to electrons incident at a further electron collection region of the third device(s) 22 (i.e. in response to ions incident at a further ion collection region)).

According to various embodiments, the ion detection system may comprise one or more focusing or defocusing devices configured to focus or defocus light (photons). The one or more focusing or defocusing devices may be configured to focus or defocus at least some of the light (photons) produced by the one or more third devices 22. In particular, the one or more focusing devices may be configured to focus or defocus light produced by the one or more third devices 22 onto one or more or each of the photodiodes or photomultipliers. This can beneficially increase the detection efficiency of the ion detection system and/or can allow the size of the photodiodes or photomultipliers to be reduced.

The one or more focusing or defocusing devices may comprise any suitable device or devices that is or are configured to focus or defocus light, such as one or more lens, one or more light guides, etc.

The degree to which the light is focussed or defocussed onto the first 20 and second 21 (and optionally further) devices may be the same or may be different. The degree to which the light is focussed or defocussed onto one or more or each of the first 20 and second 21 (and optionally further) devices may be fixed or may be variable.

The above described embodiments, where electrons are converted to photons, have the benefit that the conversion of electrons into light optically decouples the high voltages of the upstream stages of the ion detection system/mass spectrometer from the photodiodes or photomultipliers. Accordingly, the photodiodes or photomultipliers may be held at ground potential, thereby simplifying the operation of the system in both positive and negative ion mode, improving the signal integrity, and reducing the electronic pickup at the input of the digitiser(s).

According to various embodiments, the detection system may comprise one or more fourth devices 26 configured to produce output electrons in response to incident photons, wherein the one or more fourth devices 26 may be arranged so as to receive at least some of the photons produced by the one or more third devices 22.

The one or more fourth devices 26 may comprise any suitable device or devices that is or are configured to produce output electrons in response to incident photons. The one or more fourth devices 26 may comprise one or more photon-to-electron devices, such as one or more photocathode devices.

The one or more fourth devices 26 may comprise a first photon collection region and/or a second photon collection region and may be configured to produce first output electrons in response to one or more photons incident at the first photon collection region and/or to produce second output electrons in response to one or more photons incident at the second photon collection region. The one or more fourth devices 26 may further comprise one or more further photon collection regions and may be configured to produce further electrons in response to one or more photons incident at the one or more further photon collection regions.

The first photon collection region may be arranged (located) such that it receives at least some of the first photons produced by the one or more third devices 22 (in response to electrons incident at the first electron collection region of the third device(s) (i.e. in response to ions incident at the first ion collection region)) and/or the second photon collection region may be arranged (located) such that it receives at least some of the second photons produced by the one or more third devices 22 (in response to electrons incident at the second electron collection region of the third device(s) (i.e. in response to ions incident at the second ion collection region)). Where present each further photon collection region may be arranged (located) such that it receives at least some of the further photons produced by the one or more third devices 22 (in response to electrons incident at a further electron collection region of the third device(s) (i.e. in response to ions incident at a further ion collection region)).

Each of the first and second (and optionally further) photon collection regions may have any suitable effective area, i.e. area over which incident photons will give rise to output electrons. The first and second (and optionally further) effective areas may be the same area or may be different areas.

Each of the first and second (and optionally further) photon collection regions may have any suitable photon-to-electron conversion efficiency or gain. The first and second (and optionally further) photon-to-electron conversion efficiencies or gains may be the same or may be different.

In these embodiments, the first photodiode or photomultiplier 20 may be arranged (located) such that it receives at least some of the first electrons produced by the one or more fourth devices 26 (in response to photons incident at the first photon collection region of the fourth device(s) 26 (i.e. in response to ions incident at the first ion collection region)) and/or the second photodiode or photomultiplier 21 may be arranged (located) such that it receives at least some of the second electrons produced by the one or more fourth devices 26 (in response to photons incident at the second photon collection region of the fourth device(s) 26 (i.e. in response to ions incident at the second ion collection region)). Where present, each further photodiode or photomultiplier may be arranged (located) such that it receives at least some of the further electrons produced by the one or more fourth devices 26 (in response to photons incident at a further photon collection region of the fourth device(s) 26 (i.e. in response to ions incident at a further ion collection region)).

The above described embodiments, where electrons are converted to photons, and back to electrons, have the above described benefits in that the conversion of electrons into light optically decouples the high voltages of the upstream stages of the ion detection system/mass spectrometer from the photodiodes or photomultipliers, and also allows the electrons to be accelerated, e.g. to high energy, which can beneficially increase the efficiency and/or gain of the photodiodes 20, 21.

The degree to which the electrons are accelerated onto the first 20 and second 21 (and optionally further) devices may be the same or may be different. The degree to which the electrons are accelerated onto one or more or each of the first 20 and second 21 (and optionally further) devices may be fixed or may be variable.

According to various embodiments, the ion detection system is configured such that each ion incident at the one or more first devices 11 can give rise to either a first signal from the first output device, or a second signal from the second output device (or a further signal from a further output device), but not to both (or is configured to reduce the possibility of a single ion giving rise to plural signals).

In these embodiments, the first output device may be configured to output a first signal only in response to first secondary electrons produced by the one or more first devices (and not in response to second or further secondary electrons produced by the one or more first devices), and the second output device may be configured to output a second signal only in response to second secondary electrons produced by the one or more first devices (and not in response to first or further secondary electrons produced by the one or more first devices).

A single ion incident at the one or more first devices 11 could give rise to both a first signal from the first output device and a second signal from the second output device where, for example, a cloud of electrons produced by the one or more first 11 and/or second 12 and/or other devices spreads out as it travels, e.g. such that the cloud of electrons effectively overlaps with (e.g. arrives simultaneously at) both the first 14 and second 15 output devices, e.g. electrodes (or the first 20 and second 21 photodiodes or photomultipliers, etc.).

The ion detection system may be configured to prevent or reduce the possibility of a single ion giving rise to plural signals in any suitable manner.

According to various embodiments, the ion detection system comprises one or more shields or masks 13 which are appropriately arranged to achieve this, or to reduce the possibility of a single ion giving rise to plural signals.

One or more shields or masks 13 may be provided: (i) upstream of the one or more first devices 11, e.g. on a front surface or front surfaces of the one or more first devices 11; (ii) between the one or more first devices 11 and the one or more second devices 12, e.g. on a rear surface or rear surfaces of the one or more first devices 11 and/or on a front surface or front surfaces of the one or more second devices 12, or otherwise; (iii) between the one or more first 11 or second 12 devices and the one or more third devices 22, e.g. on a rear surface or rear surfaces of the one or more first 11 or second 12 devices and/or on a front surface or front surfaces of the one or more of the third devices 22, or otherwise; and/or (iv) between the one or more first 11, second 12 or third 22 devices and the first 14 and second output devices, e.g. electrodes 15, e.g. on a rear surface or rear surfaces of the one or more first 11, second 12 or third devices 22, or otherwise.

One or more or each of the mask or masks 13 may be arranged (located) so as to intercept or impede ions, electrons or photons that would otherwise give rise to plural output signals (from a single ion). In particular, one or more or each of the mask or masks 13 may be aligned with the boundary or boundaries between the first 14 and second 15 (and optionally further) output devices, e.g. electrodes.

According to various further embodiments, the one or more first 11 and/or second 12 devices may comprise one or more inactive (non-active) regions 24 that may be configured, e.g. so as not to output secondary electrons in response to incident ions and/or electrons, or to output a reduced number of secondary electrons in response to incident ions and/or electrons (e.g. compared to the other (active) regions of the device(s)).

The one or more inactive regions 24 may be arranged (located) in order to prevent or reduce the possibility of a single ion incident at the one or more first devices 11 causing both the first output device, e.g. electrode 14, to output a first signal and the second output device, e.g. electrode 15, to output a second signal. One or more or each of the inactive region or regions 24 may be arranged (located) so as to intercept or impede ions or electrons that would otherwise give rise to plural output signals (from a single ion). In particular, one or more or each of the inactive region or regions 24 may be aligned with the boundary or boundaries between the first 14 and second 15 (and optionally further) output devices, e.g. electrodes.

Where the ion detector device comprises one or more first ion-to-electron devices 11 and one or more second electron multiplier devices 12 (as described above), then one or more inactive regions 24 may be provided in the one or more first ion-to-electron devices 11, in the one or more second electron multiplier devices 12, or in both the one or more first ion-to-electron devices 11 and the one or more second electron multiplier devices 12. One or more or each of the inactive regions 24 may be aligned with the boundary or boundaries between the first 14 and second 15 (and optionally further) output devices, e.g. electrodes.

The approach according to these embodiments has the benefit that first 11 and second 12 devices (e.g. MCP plates) may be positioned closer together e.g. compared with embodiments that include a shield or a mask 13, so that electron spreading between the devices (plates) is reduced or minimised. The approach according to these embodiments additionally limits the formation of secondary positive ions, which may be formed by electrons striking a shield or a mask 13, and which may be accelerated back into the device (e.g. MCP channel) thereby potentially causing destructive ion feedback.

The one or more inactive regions 24 may be formed in any suitable manner. For example, the one or more inactive regions 24 may be formed in accordance with the technique disclosed in U.S. Pat. No. 7,687,759 (Brown et al.). Additionally or alternatively, the one or more inactive regions 24 may be formed by providing regions which do not have an electron emissive coating, or by providing MCP plate regions in which the pores are blocked or partially blocked.

According to various embodiments, one or more shielding electrodes 16 may be provided, e.g. between the first 14 and second 15 (and optionally further) electrodes, which may be configured to prevent or minimise capacitive coupling between the first 14 and second 15 (and optionally further) electrodes. This may also have the effect of preventing or reducing the possibility of a single ion giving rise to plural signals, e.g. which might otherwise arise due to spurious signals from capacitive coupling of the electrodes.

According to various embodiments, one or more grids or other devices 19 may be provided upstream of the one or more first devices 11, wherein a (e.g. positive) potential may be applied to the one or more grids or other devices 15. This may be done so that any secondary electrons produced at the input to the one or more first devices 11, e.g. due to ions incident on the one or more masks 13 or otherwise, may be removed and prevented from creating a spurious signal.

Although as described above, the ion detection system may be configured such that each ion incident at the one or more first devices 11 can give rise to either a first signal from the first output device, or a second signal from the second output device (or a further signal from a further output device), but not to both (or is configured to reduce the possibility of a single ion giving rise to plural signals), in various alternative embodiments, the ion detection system is configured such that each (and every) ion incident at the (first and second ion collection region of the) one or more first devices 11 will give rise to both a first signal from the first output device, and a second signal from the second output device (and optionally a further signal from a further output device).

That is, the ion detection system may be configured such that each single ion incident at the (first and second ion collection region of the) one or more first devices 11 gives rise to both a first signal from the first output device and a second signal from the second output device. In these embodiments, the first output device will be configured to output a first signal in response to first secondary electrons produced by the one or more first devices and in response to second secondary electrons produced by the one or more first devices (and optionally in response to further secondary electrons produced by the one or more first devices). Correspondingly, the second output device may be configured to output a second signal in response to second secondary electrons produced by the one or more first devices and in response to first secondary electrons produced by the one or more first devices (and optionally in response to further secondary electrons produced by the one or more first devices).

The ion detection system may be configured to do this in any suitable manner.

As described above, each cloud of electrons produced by the one or more first 11 and/or second 12 and/or other devices may spread out as it travels, e.g. such that the cloud of electrons effectively overlaps with (e.g. arrives simultaneously at) both the first 14 and second 15 output devices, e.g. electrodes (or the first 20 and second 21 photodiodes or photomultipliers, etc.). One or more electron focusing or defocusing devices may be provided for this purpose and/or to ensure that secondary electrons produced in response to ions incident at any point at the (first and second ion collection region of the) one or more first devices 11 will give rise to both a first signal from the first output device and a second signal from the second output device. In this case, each of the one or more electron focusing or defocusing devices may comprise any suitable such device, such as one or more electrostatic focusing or defocusing devices, lenses or electrodes, etc.

In these embodiments, the system may be arranged such that the number of electrons incident at each of the output devices (in response to each single ion incident at the one or more first devices) is substantially the same or is different.

The ion detection system comprises a (first) digitiser 17 configured to digitise the first signal to produce a first digitised signal, and a (second) digitiser 18 configured to digitise the second signal to produce a second digitised signal. Where the ion detection system comprises one or more further output devices, e.g. electrodes, the ion detection system may comprise one or more (further) digitisers, e.g., each of which may be configured to digitise the signal output by a further output device.

According to various further embodiments, one or more of the first and/or second (and/or further) signals may be split between two or more digitisers. Each signal may be split between any number of digitisers, however according to various embodiments, each signal is (either not split or is) split between only two (and no more than two) digitisers. Splitting each signal between no more than two digitisers facilitates an increased dynamic range ion detection system, e.g. that does not suffer from problems associated with splitting the output from a single collection electrode between more than two digitisers (e.g. problems associated with saturation of the input for one of the amplifiers affecting the input conditions for the other amplifier(s), and problems associated with increasing the gain of the ion-to-electron (electron multiplier) device).

Accordingly, the ion detection system may comprise a first splitter or divider configured to split or divide the first signal into (at least) a first part (or percentage) of the (amplitude of the) first signal and a second different part (or percentage) of the (amplitude of the) first signal and/or a second splitter or divider configured to split or divide the second signal into (at least) a second part (or percentage) of the (amplitude of the) second signal and a second different part (or percentage) of the (amplitude of the) second signal. Each signal may be split or divided equally or unequally.

In these embodiments, the first digitiser may be configured to digitise a part, e.g. the first part, of the first signal to produce the first digitised signal and/or the second digitiser may be configured to digitise a part, e.g. the first part, of the second signal to produce the second digitised signal. The ion detection system may comprise one or more third digitisers configured to digitise a part, e.g. the second part, of the first signal to produce one or more third digitised signals and/or one or more fourth digitisers configured to digitise a part, e.g. the second part, of the second signal to produce one or more fourth digitised signals.

Each of the (e.g. first 17 and second 18 (and optionally further)) digitisers may comprise any suitable digitiser, such as an analogue to digital converter (ADC). The first and second signals may be digitised by separate, e.g. distinct, digitisers, or by shared digitising processing circuitry.

One or more or each signal may be input directly to the respective digitiser, or may be amplified or attenuated prior to being digitised.

Thus, the ion detection system may comprise one or more amplifiers and/or one or more attenuators. In particular, the ion detection system may comprise a first amplifier or a first attenuator configured to amplify or attenuate the first signal prior to the amplified or attenuated first signal being digitised (by the first digitiser 17) and/or a second amplifier or a second attenuator configured to amplify or attenuate the second signal prior to the amplified or attenuated second signal being digitised (by the second digitiser 18) and/or a third amplifier or a third attenuator configured to amplify or attenuate the first signal prior to the amplified or attenuated first signal being digitised (by the third digitiser) and/or a fourth amplifier or a fourth attenuator configured to amplify or attenuate the second signal prior to the amplified or attenuated second signal being digitised (by the fourth digitiser). The ion detection system may optionally comprise one or more further amplifiers or one or more further attenuators, each of which may be configured to amplify or attenuate a further signal prior to the amplified or attenuated further signal being digitised (by a further digitiser).

The amplifiers may be provided as separate, e.g. distinct, amplifiers, or as shared amplifying processing circuitry.

In these embodiments, the gain of the first, second, third and/or fourth (and optionally further) amplifiers or attenuators may be the same or different, i.e. the first, second, third and/or fourth (and optionally further) signals may be amplified or attenuated by the same or different amounts.

According to one particular embodiment, the signal from one of the first and second output devices, e.g. electrodes, is digitised without being split (optionally via an amplifier or attenuator), and the signal from the other output device, e.g. electrode, is (e.g. equally) split and digitised by two separate digitisers via two different amplifiers or attenuators that are operated with different gains.

The ion detection system further comprises processing circuitry configured to determine first intensity and arrival time, mass or mass to charge ratio data from the first digitised signal, processing circuitry configured to determine second intensity and arrival time, mass or mass to charge ratio data from the second digitised signal, and processing circuitry configured to combine the first intensity and arrival time, mass or mass to charge ratio data and the second intensity and arrival time, mass or mass to charge ratio data to form a combined data set.

The processing circuitry may be in the form of one or more fixed-function units (hardware), and/or in the form of programmable processing circuitry (hardware) that can be programmed to perform the desired operation. Any one or more of the processing circuitry may be provided as a separate circuit element to any one or more of the other processing circuitry, and/or any one or more or all of the processing circuitry may be at least partially formed of shared processing circuitry.

The digitisers and processing circuitry may be provided, for example, in the control system 5. Other arrangements would, however, be possible.

The intensity and arrival time, mass or mass to charge ratio data may take any suitable form. The data may be in the form of one or more time-intensity pairs, i.e. data values comprising a time of flight value together with an intensity value. Accordingly, each digitised signal may be reduced from a continuous (or discrete) signal into one or more data pairs. This may be done by a suitable peak detection algorithm. This has the effect of reducing the amount of data that must be processed and stored.

These embodiments also facilitate combining the signals from the first 14 and second 15 output devices in a convenient and straightforward manner, and e.g. can beneficially remove the need for complex calibration and clock phase locking between the first 17 and second 18 digitisers. This is because the data pairs can be straightforwardly combined, e.g. using one or more times offsets and/or one or more intensity corrections, e.g. that may be determined in a calibration step.

Accordingly, the first intensity and arrival time, mass or mass to charge ratio data and/or the second intensity and arrival time data may be suitably corrected and/or scaled before being combined. All of the first and second data may be combined to form the combined data set, or alternatively any saturated and/or distorted data, e.g. of one of the first or second data may be replaced by corresponding data from the other data.

The first and second intensity and arrival time, mass or mass to charge ratio data (and correspondingly the combined data set) may correspond to a single time of flight transient or push. Each combined data set may then be combined with other (previous or subsequent) combined data sets, i.e. each of which may correspond to another time of flight transient or push.

As described above, various embodiments are directed to an increased dynamic range ion detection system. In order to provide the increased dynamic range, the first and second digitised signals should correspond to (and according to various embodiments do correspond to) different intensities.

For example, the first intensity and arrival time, mass or mass to charge ratio data may correspond to "high intensity" data, and the second intensity and arrival time, mass or mass to charge ratio data may correspond to "low intensity" data, or vice versa. By combining such data in accordance with various embodiments, the combined data set will have an increased dynamic range.

The ion detection system may be configured to provide high and low intensity data in any suitable manner.

According to various embodiments, the first and second digitised signals correspond to different ion arrival rates at the one or more first devices. That is, the first and second digitised signals may correspond to different proportions of the total ion population detected by the ion detection system. This may be achieved as desired.

According to various embodiments, the incoming ion flux for the first and second ion collection regions of the one or more first devices 11 may be different.

According to various embodiments, the incoming ion beam may be focused or defocussed, e.g. using electrostatic lenses, etc., onto the first and second ion collection regions of the one or more first devices 11 to different degrees.

According to various embodiments, the transmittance of ions onto the first and second ion collection regions of the one or more first devices may be different. For example, one or more (partial) masks or ions gates 25 may be provided upstream of the one or more first devices 11, where the one or more (partial) masks or ions gates 25 may be configured to intercept or impede some proportion of ions. The one or more masks or ions gates 25 may be aligned with either the first ion collection region of the one or more first devices 11 and/or with the second ion collection region of the one or more first devices 11, e.g. such that the first and second ion collection regions receive different proportions of the incoming ions. Additionally or alternatively, the ion detection system may comprise one or more ion focusing or defocusing devices configured to focus or defocus some or all of the incident ions. In particular, the one or more ion focusing or defocusing devices may be configured to focus or defocus ions onto the first and/or second (and optionally further) ion collection regions, where the degree to which the ions are focussed or defocussed onto the first and second (and optionally further) ion collection regions may be the same or may be different. The degree to which the ions are focussed or defocussed onto one or more or each of the first and second (and optionally further) ion collection regions may be fixed or may be variable.

According to various embodiments, the effective ion collection areas of the first and second ion collection regions of the one or more first devices 11 may be different.

The high and low intensity data may additionally or alternatively be provided by configuring the ion detection system such that the overall ion to first digitised signal efficiency or gain is different to the overall ion to second digitised signal efficiency or gain. That is, the first and second digitised signals may correspond to signals that have been amplified (or attenuated) by different degrees. The difference in overall ion detection efficiency or gain may be achieved in any suitable manner.

According to various embodiments, the effective electron collection areas of the first and second electron collection regions of the one or more second devices 12 may be different.

According to various embodiments, the effective electron collection areas of the first and second electron collection regions of the one or more third devices 22 may be different.

According to various embodiments, the effective photon collection areas of the first and second photon collection regions of the one or more fourth devices 26 may be different.

According to various embodiments, the effective electron collection areas of the first 14 and second 15 electrodes may be different.

According to various embodiments, the effective electron or photon collection areas of the first 20 and second 21 photodiodes or photomultipliers may be different.

According to various embodiments, the electron and/or photon flux between the one or more first devices 11 and the output devices, e.g. electrodes 14, 15, may be different in respect of signal produced at the first 14 and second 15 output devices. For example, the electrons and/or photons may be focused (or defocussed) to different degrees, or the transmittance of the electrons and/or photons may be different.

According to various embodiments, the ion-to-electron conversion efficiency or gain of the one or more first devices 11 may be different for the first and second ion collection regions. For example, the one or more first devices may be provided with different electron emissive coatings, and/or different densities of active micro-channels at the first and second ion collection regions.

Additionally or alternatively, the first and second ion collection regions may be provided with different bias voltages (e.g. as described above).

According to various embodiments, different number of first and/or second stages or devices (e.g. MCP plates) may be provided in respect of the first and second ion collection regions. For example, one of the regions may comprise only a single MCP plate, where the other may comprises plural MCP plates in series.

According to various embodiments, the electron multiplication gain of the one or more second devices 12 may be different for the first and second electron collection regions.

According to various embodiments, the electron-to-photon conversion efficiency or gain of the one or more third devices 22 may be different for the first and second electron collection regions.

According to various embodiments, the photon-to-electron conversion efficiency or gain of the one or more fourth devices 26 may be different for the first and second photon collection regions.

According to various embodiments, the electron collection efficiency or gain of the first 14 and second 15 electrodes may be different.

According to various embodiments, the electron or photon collection efficiency or gain of the first 20 and second 21 photodiodes or photomultipliers may be different.

Additionally or alternatively, the first and second signals output by the first and second output devices, e.g. collection electrodes, may be amplified or attenuated by different amounts.

It will be appreciated that any two or more of these embodiments may be combined, as appropriate, e.g. in order to provide an increased dynamic range ion detection system. More generally, each of the embodiments described herein can, and in various embodiments do, include any one or more or all of the optional features described herein.

Various particular embodiments will now be described in more detail.

FIG. 2A shows a multi-anode MCP electron multiplier device comprising a dual chevron micro-channel plate (MCP) electron multiplier 11, 12, and two separate secondary electron collection anodes 14, 15, in accordance with an embodiment.

As shown in FIG. 2A, ions striking the input surface of the first MCP plate 11 will cause clouds of secondary electrons to be emitted from the output surface of the second MCP plate 12. The secondary electrons are incident on the anodes 14, 15 which produce corresponding output signals.

In the arrangement illustrated in FIG. 2A, one of the anodes 14 may have a larger effective electron collection area than the other anode 15.

Shielding electrodes or masks 13 may be provided and positioned to ensure that minimal or no secondary electrons arising from the same ion strike at the input of the first MPC plate 11 are shared between the two anodes 14, 15. A shield or mask 13 may be situated at the input to the first MCP plate 11 to restrict the primary ion beam, and/or between the first 11 and second 12 MCP plates and/or after the second MCP plate 12 in order to restrict the spread of secondary electrons prior to the anodes 14, 15.

A grid 19 may be provided upstream of the first MCP plate 11, which may be biased at a relatively more positive potential than the input surface of the first MCP plate 11, e.g. to ensure that any secondary electrons created when ions hit the shield 13 on the input of the first MCP plate 11 or when ions hit the surface of the MCP plate between channels are removed before they can enter the MCP channels and give rise to spurious signals.

One or more electrodes 16 may be provided as an electrical shielding region to limit or minimise capacitive coupling between the anodes 14, 15, which could also lead to spurious signals.

In the embodiment illustrated by FIG. 2A, the output of the anodes 14, 15 are capacitively de-coupled and directed to respective analogue to digital convertors ("ADCs") 17, 18, e.g. via a 50 ohm impedance transmission line and optional analogue pre-amplification stages.

FIG. 2B shows a top-view of the anode arrangement of FIG. 2A (i.e. in the z-y direction, where the x direction is the axial direction of the incoming ion beam). The area of the two anodes 14, 15 illuminated by the ion beam for a typical orthogonal acceleration-Time of Flight ("oa-ToF") instrument is indicated by the dotted line. In this orientation, any differences in the distribution of ions of different mass to charge ratios ("m/z") and/or charge states in the x direction will have minimal impact on the relative ratio of ions striking the first MCP plate 11.

Figure 2:
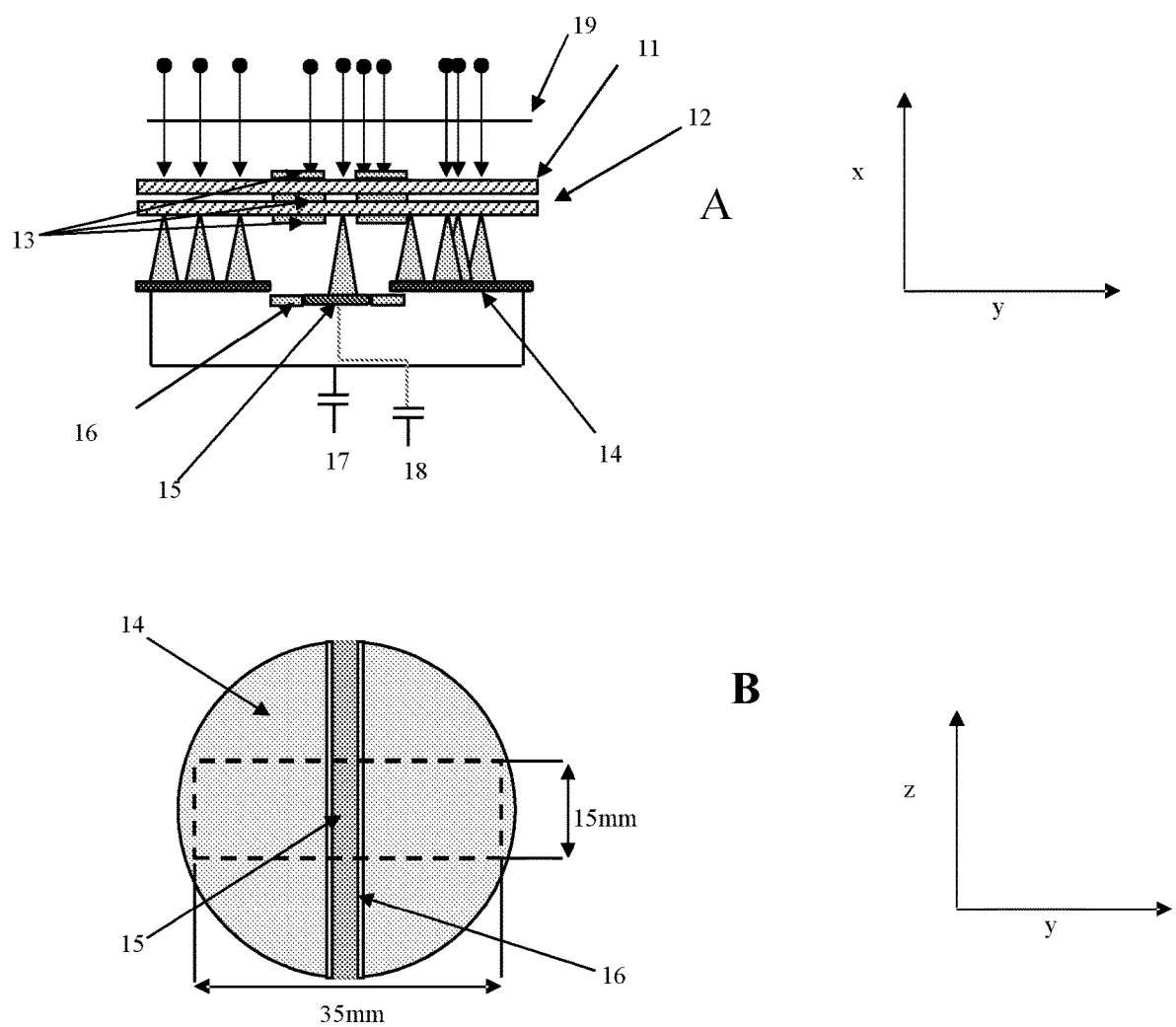
FIG. 2A illustrates schematically a cross-sectional view at an ion detection system in accordance with an embodiment.
FIG. 2B illustrates schematically a top view of an anode arrangement of the ion detection system of FIG. 2A.
Figure 3:
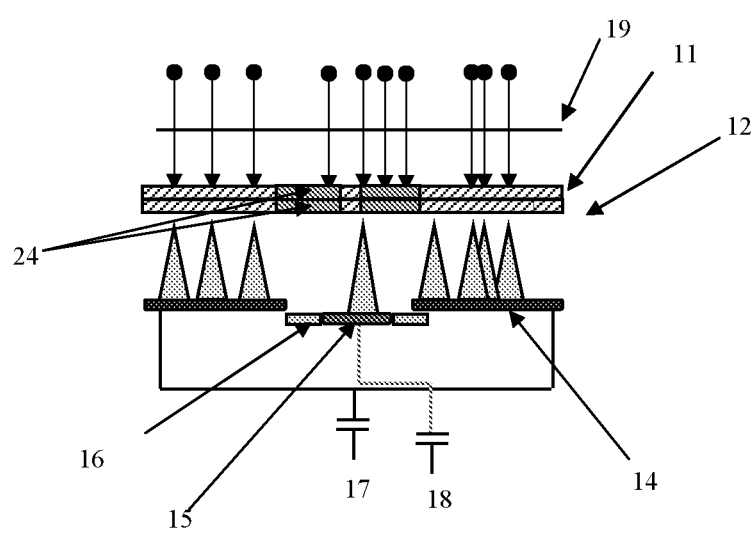
FIG. 3 illustrates schematically a cross-sectional view of an ion detection system in accordance with an embodiment.

FIG. 3 illustrates an alternative embodiment, wherein an MCP device may be provided with one or more non-active areas 24. One or both of the MCP plates 11, 12 may be deliberately manufactured with one or more non-active areas 2. The inactive region(s) 24 may be positioned so that they effectively act as a mask for the same purpose as the masks 13 shown in FIG. 2, i.e. to ensure that minimal or no secondary electrons arising from the same ion strike at the input of the first MPC plate 11 are shared between the two anodes 14, 15.

Compared to the embodiment illustrated by FIG. 2, this approach has the benefit that the MCP plates 11, 12 may be held closer together, so that electron spreading between the plates is reduced or minimised. This approach also limits the formation of secondary positive ions, which may be formed by electrons striking a mask 13 between the plates 11, 12 or on the output of the second plate 12. Such secondary positive ions may be accelerated back into an MCP channel above, thereby causing destructive ion feedback.

In these embodiments, the one or more inactive areas 24 may be formed in any suitable manner. For example, U.S. Pat. No. 7,687,759 (Brown et al.) describes a method by which inactive areas may be formed within an MCP device during the manufacturing process. This is done in U.S. Pat. No. 7,687,759 (Brown et al.) to facilitate the manufacture of slots in the plate to accommodate wires. However, this technique may be adapted in accordance with various embodiments described herein.

The active area or areas of the MCP device are formed by stacking fibre optic channels having acid etchable core rods and acid resistant cladding glass surrounding the etchable core rods. The non-active area or areas are formed by stacking fibre optic channels having acid resistant core rods and acid resistant cladding glass surrounding the resistant core rods.

Once the rods are stacked the billet or bundle of rods is drawn to reduce the diameter. MCP plates are then sliced from the boule, and polished. Chemically etching each plate forms micro-channels in the active area(s) for multiplying electrons, and inactive area(s) with no micro-channels. A process of hydrogen reduction produces a resistive electron emissive layer. Finally, conductive electrode material is deposited onto selected parts of the surface to allow voltages to be applied to the MCP device.

The MCP plates may be manufactured by other methods. For example, the emissive surface may be made by vapour deposition or atomic layer deposition ("ALD"), rather than hydrogen reduction. Ceramic and silicon and standard glass (rather than lead glass) MCP plates can also be made to have inactive areas in a corresponding manner.

In these embodiments, one or both of the first 11 and second 12 MCP plates may have inactive region(s). Where both of the MCP plates 11, 12 have inactive region(s), then the inactive regions can have the same size and/or position (i.e. the inactive regions of the two MCP plates may overlap). Alternatively, the inactive regions 24 on each MCP plate may be different in size and/or position. This may be done to further limit cross-talk, e.g. by preventing electrons which diverge when exiting a channel on the first plate 11 hitting any channels in the second plate 12.

According to various other embodiments, the shielding effect may be achieved by providing pores in the MCP device which do not have an electron emissive coating, or by providing regions in which the pores are blocked or partially blocked.

Figure 4:
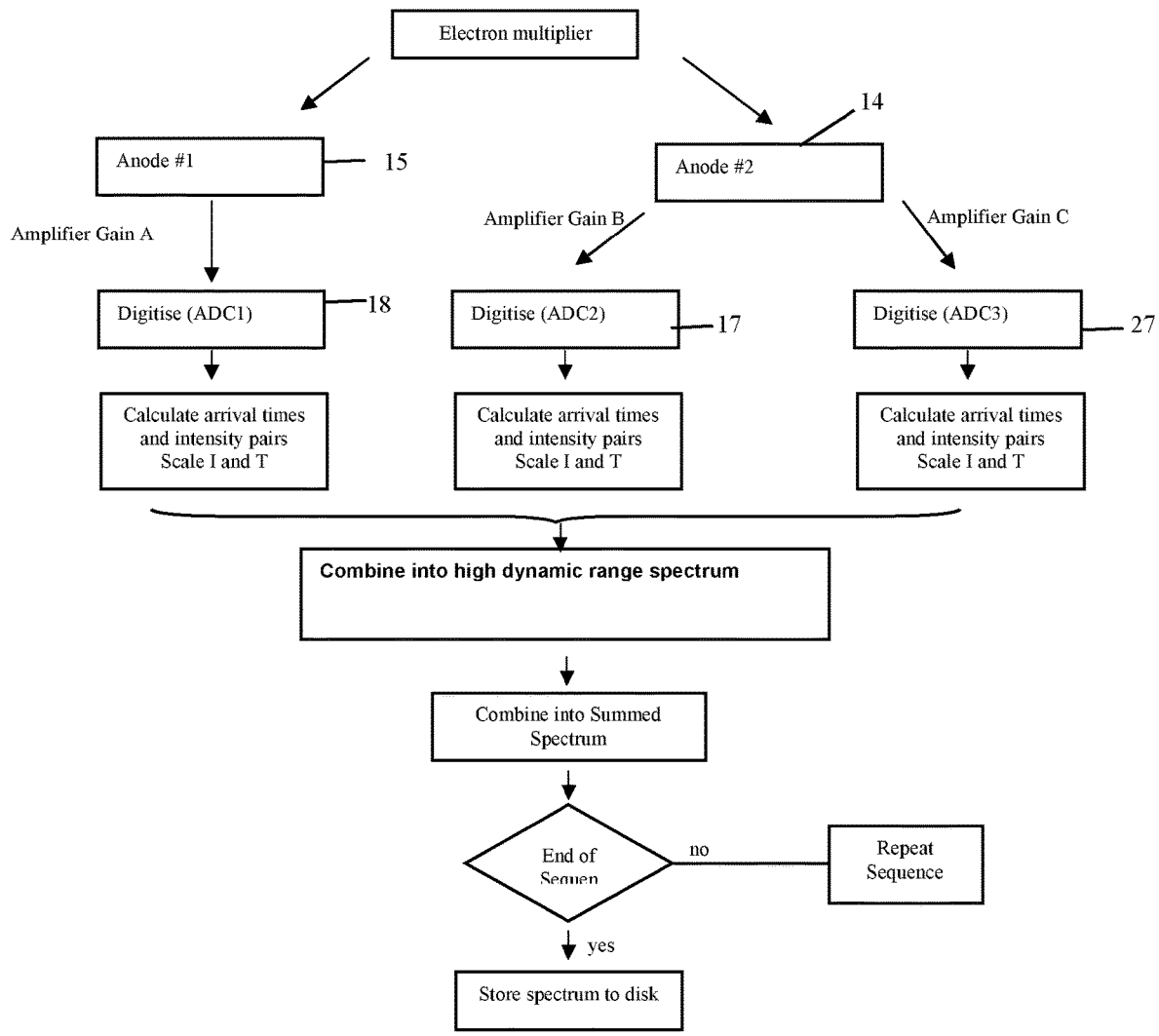
FIG. 4 illustrates schematically an ion detection system in accordance with an embodiment.

FIG. 4 illustrates an embodiment of an ion detection system comprising a single electron multiplication device that has a single gain value, and two separate secondary electron collection anodes 14, 15 (which may be arranged as in FIG. 2 or 3). The collection anodes 14, 15 are attached to separate ADCs via separate pre-amplification stages.

In this embodiment, the signal from the first anode 15 ("anode #1") is amplified by a first amplifier ("amplifier A") and digitised by a first ADC 18 ("ADC1"). The digitised signal is reduced to one or more time and intensity pairs.

Signal from the second anode 14 ("anode #2") is split into two parts. One part is amplified by a second amplifier ("amplifier B"), and digitised by a second ADC 17 ("ADC2") before being reduced to one or more time-intensity pairs. The second part is amplified by a third amplifier ("amplifier C"), digitised by a third ADC 27 (ADC3) and reduced to one or more time-intensity pairs.

The time-intensity pairs are adjusted in time and intensity based on previously determined calibration routines to account for time differences between the different signal paths, and to normalise the intensity for the different overall gains and collection efficiencies for each of the signal paths.

The time-intensity pairs recorded within a single time of flight transient are combined into a single high dynamic range spectrum. Finally, this high dynamic range spectrum is then combined with other, previously recorded, spectra.

In the following example it is assumed that an incoming ion population is distributed uniformly over the surface of the first MCP plate 11.

For an electron multiplier gain of $2e^5$, a single ion pulse width of 1 ns and a multiple ion arrival envelope of 1 ns, a single ion will have an average amplitude of 2 mV into a 50 ohm impedance output line on either anode. A single ion giving rise to a cascade of electrons which arrive on the second anode 14 results in a 2 mV pulse with 1 ns FWHM. After evenly splitting the incoming signal, the amplitude at the input of the second and third amplifiers is 1 mV.

With a gain of ×20 for the second amplifier, the input to the second (e.g. 10 bit) ADC 17 ("ADC2") is 20 mV or 20 least significant bits ("LSB").

Therefore, the second ADC 17 ("ADC2") can digitise up to 50 ipp (approx. 1 volt into 50 ohms at the input of the ADC) arriving at the input of the electron multiplier and giving rise to secondary electrons incident on the second anode 14, before significant ADC saturation occurs.

If the third amplifier has a gain that is $1/20^{th}$ the gain of the second amplifier (i.e. ×2), the input of the third ADC 27 ("ADC3") at 50 ipp is 50 mV. Therefore the third ADC 27 ("ADC3") can digitise up to 1000 ipp before significant ADC saturation occurs.

If the first anode 15 has a collection area that is $1/10^{th}$ of the collection area of the second anode 14, at the point that the signal on the third ADC 27 ("ADC3") saturates (1000 ipp), the second anode 14 will receive secondary electrons from an average ion arrival rate of 100 ions per push. At a gain of $2.5e^5$, this is on average a 200 mV pulse.

With a gain of ×0.1 for the first amplifier, the input at the first ADC 18 ("ADC1") at 100 ipp is 20 mV. Therefore, the first ADC 18 ("ADC1") can digitise up to 50,000 ipp before significant saturation occurs.

As the first anode 15 has an area that is $1/10^{th}$ of the size of the second anode 14, the overall efficiency of ion collection is reduced by approximately 10%. In practice, as shielding 13 may also be included, the total collection area may be reduced further.

It should be noted here that the anode sizes given in the various examples described herein are merely exemplary, and that the anode sizes may differ by different ratios according to various embodiments. Equally, the relative gains of the amplification stages may be set as desired.

In the embodiment illustrated by FIG. 4, the dual gain ADC is attached to the larger anode 14. This has the benefit that the signal from the larger anode 14 is statistically more reproducible (i.e. includes more ions per push) than the signal from the smaller anode 15. However, in this configuration the high gain analogue amplifier on the larger anode 14 may be driven into input saturation, which may affect the low gain amplifier. This may affect, e.g., signals in the same TOF transient at longer flight times derived from the low gain ADC (depending on the recovery time of these components). Therefore, the dual gain ADC may instead be attached to the smaller anode 15. This arrangement will achieve the same dynamic range increase.

Figure 5:
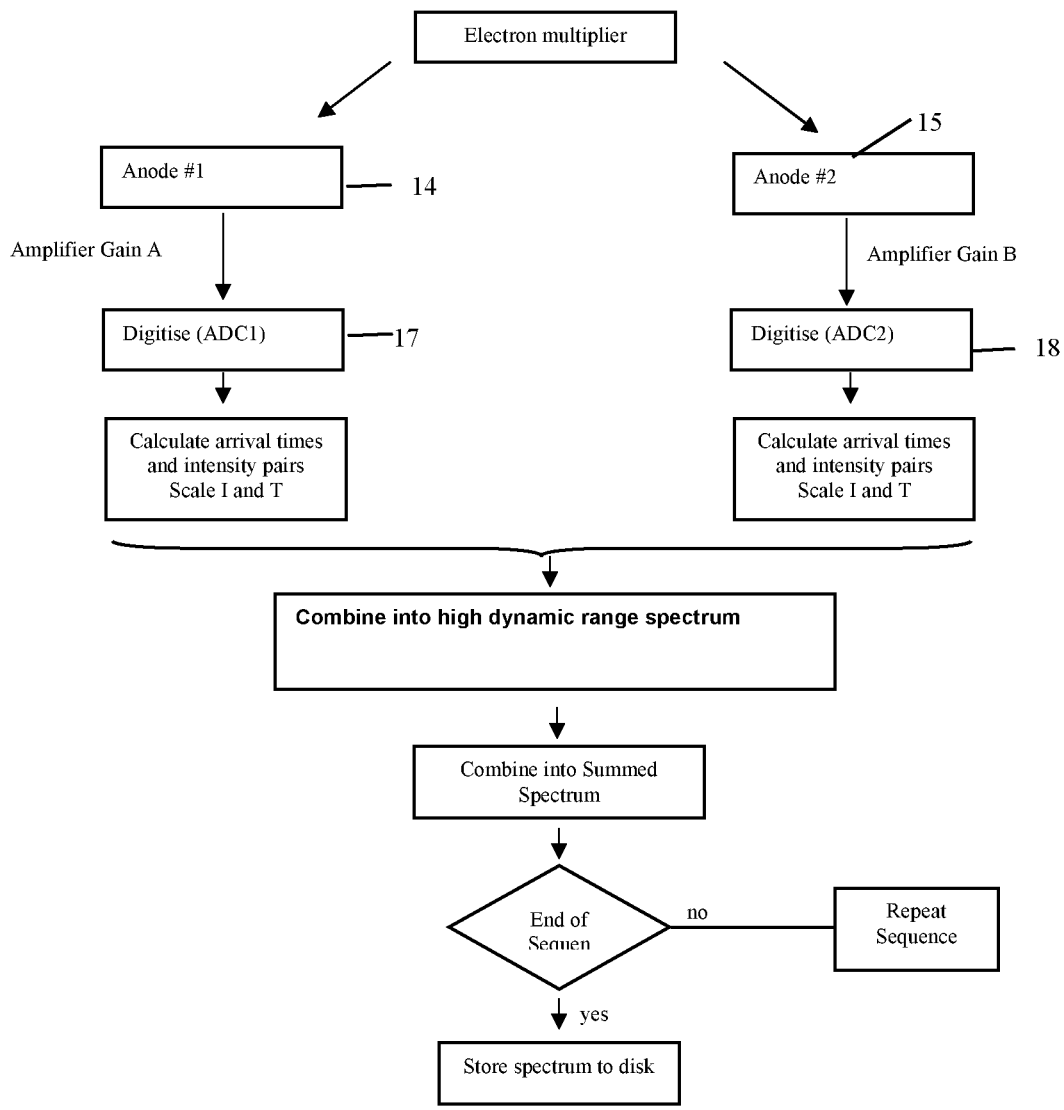
FIG. 5 illustrates schematically an ion detection system in accordance with an embodiment.

FIG. 5 shows an embodiment of an ion detection system wherein each anode 14, 15 is attached to a single analogue to digital converter ("ADC") via an amplifier. In this embodiment, the gains of each amplification stage and the size ratio of the anodes 14, 15 will determine the overall dynamic range of the system.

Thus, for example, where the gain of the first amplifier ("amplifier A") is ×10, the second ADC 18 ("ADC 2") has a maximum ion arrival rate of 50 ipp. If the size of the second smaller anode 15 is $1/10^{th}$ of the size of the first larger anode 14, for an ion flux of 50 ipp on the larger anode 14, the smaller anode 15 will receive an ion input flux of 5 ipp, resulting in a 10 mV signal. Where the gain of the first amplifier ("amplifier A") is ×2, the first ADC 17 can digitise up to 2500 ipp before significant saturation occurs.

It would not be possible to significantly further reduce the analogue gain to improve the dynamic range without loss of signal, e.g. below any electronic noise threshold.

The second anode 15 could be reduced in area, e.g. to $1/100^{th}$ of the area of the first anode 14, thereby resulting in an arrival rate of 0.5 ipp. However there would then be a significant number of single ion arrivals, thereby requiring a gain of ×20 for the first amplifier ("amplifier A") and resulting in an increase to a maximum of 5000 ipp for the first ADC 17 ("ADC1"). In addition, the signal on the second anode 15 would be relatively statistically imprecise due to the small number of ion arrivals per unit time.

Figure 6:
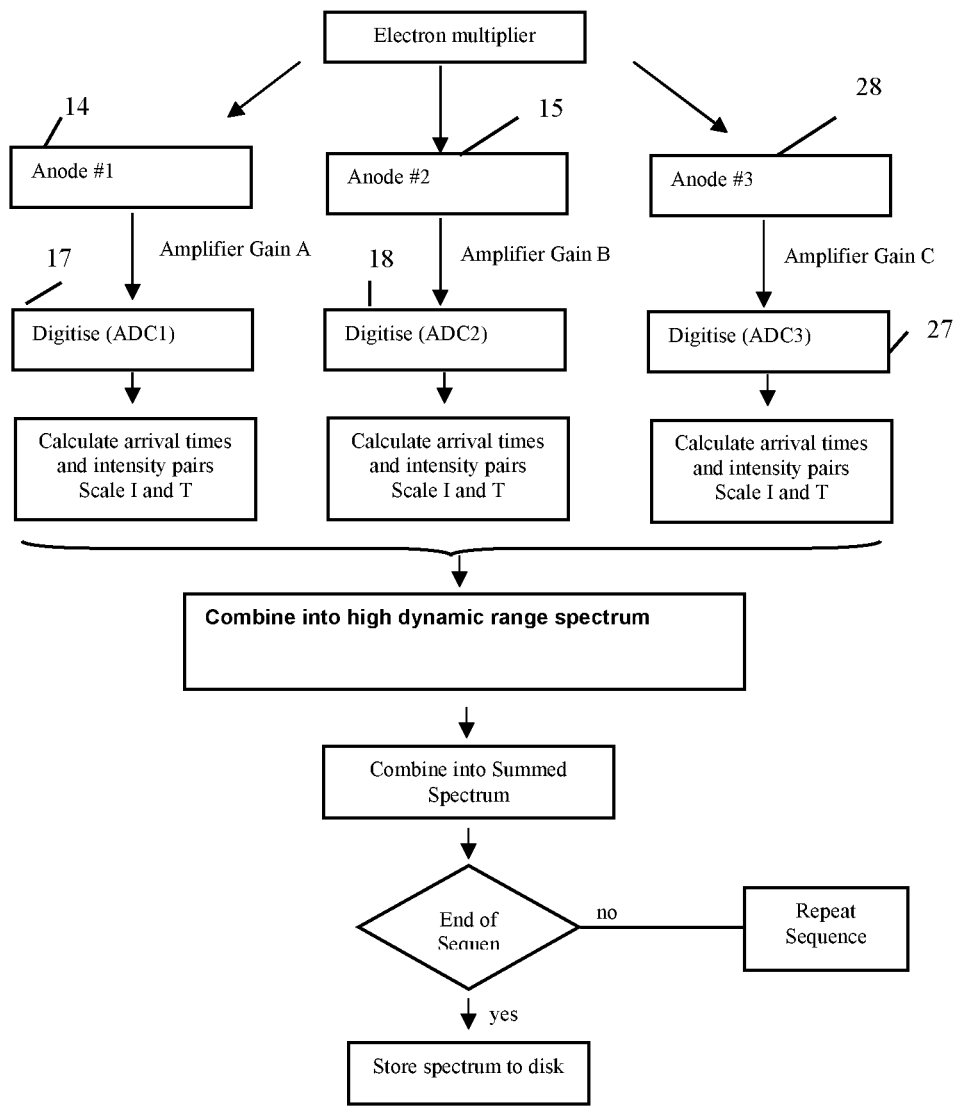
FIG. 6 illustrates schematically an ion detection system in accordance with an embodiment.

FIG. 6 shows an improved version of the embodiment shown in FIG. 5. In this embodiment, three anodes 14, 15, 28 of differing sizes are provided.

In this embodiment, the second anode 15 ("anode 2") could have an area that is $1/10^{th}$ of the area of the third anode 28 ("anode 3"), and the first anode 14 ("anode 1") could have an area that is $1/100^{th}$ of the area of the third anode 26 ("anode 3"). With a gain of ×2 for the second amplifier ("amplifier B"), the second ADC 18 ("ADC2") can digitise up to 2500 ipp before significant saturation occurs. At this point the first anode 14 ("anode 1") will receive an ion input flux of 250 ipp, thereby resulting in an average signal intensity of 500 mV. Therefore, at a gain of 0.04 for the first amplifier ("amplifier A"), the first ADC 17 ("ADC1") can digitise up to 12,500 ipp before significant saturation occurs.

The size of the first anode 14 ("anode 1") could be reduced further according to various embodiments, although there are practical limits to the physical size of the anode which ultimately limit this approach to achieve very high dynamic range.

However, reducing the digitised signals to time-intensity pairs before combining the time-intensity pairs into a wide dynamic range spectrum in accordance with various embodiments allows seamless integration of these independent devices without complex phase locking processes. This facilitates extending the techniques described herein to complex multi-anode systems, where only a single pre-calibration step is required for each anode.

Many other combinations of anodes combined with single and dual gain amplifier/ADC combinations can be envisaged in accordance with various embodiments.

In the embodiments described in FIGS. 1-6, no consideration has been given to the capability of the electron multiplier to generate a linear response to a very large population of ions, e.g. that may arrive within 1 ns in a single time of flight transient.

For a gain of $2.5e^5$, a pulse of 50,000 ions with a FWHM of 1 ns corresponds to 2 nA of output current and an amplitude of 100 V with 50 ohm output impedance. In ion mobility mode, the signal may only remain at this intensity for a few hundreds of microseconds before falling to a lower value, and so the average output current (in DC operation) is generally well within the operational range of most ion detectors, for example, in the range 1-10 μA.

However, very few, if any, electron multipliers are capable of delivering a linear 100V pulse response.

Various further embodiments relate to combinations of multi-anodes and multiple electron multipliers, together with the techniques of combining signals from multiple peak detecting ADCs described above.

Figure 7:
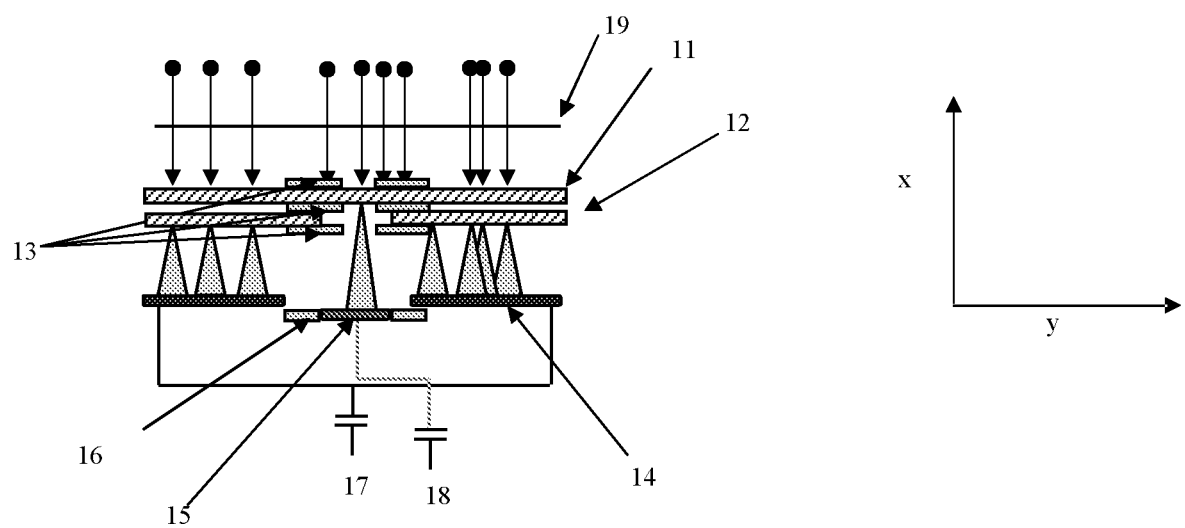
FIG. 7 illustrates schematically a cross-sectional view of an ion detection system in accordance with an embodiment.

FIG. 7 shows an example of an ion detector according to an embodiment. In FIG. 7, the lower MCP plate 12 has a slot, e.g. extending in the z direction. Alternatively the lower MCP plate 12 may be split into two completely separate devices. The slot or the gap between the devices is arranged so that it is aligned with, e.g. overlaps with, the second anode 15. Accordingly, for a given MCP bias voltage, the gain for ions which give rise to secondary electrons incident at the larger anode 14 is greater than the gain for ions which give rise to secondary electrons incident on the smaller anode 15.

In these embodiments, the bias voltage for each MCP plate 11, 12 may be independently supplied, e.g. by two decoupled power supplies. The second output MCP plate 12 will age at a faster rate than the first MCP plate 11 because more electrons will be produced by the second MCP plate 12. Independent control of the gain of the two plates 11, 12 allows adjustment of the gains to maintain the desired gain ratio.

In the example described above in relation to FIG. 4, the gain of the first amplifier ("amplifier A") is ×0.1, resulting in a 20 mV response for 100 ipp. If the gain of the electron multiplier supplying electrons to the first anode 14 ("anode 1") is set to be 100× lower than the gain of the electron multiplier supplying electrons to the second anode 15 ("anode 2"), the gain of the first amplifier ("amplifier A") may be increased to ×10, resulting in the same wide dynamic range.

Therefore, following the example given previously in relation to FIG. 4, the gain difference between the electron multipliers may be in the order of ×100. This will depend on the relative sizes of the anodes and the relative gains of the amplifiers.

For a gain of $2.5e^5$ for the first anode 14, the gain of the first MCP plate 11 would need to be $2.5e^4$. This is near the limit of the maximum gain achievable for a single MCP plate. Reducing the gain of the electron multiplier reduces output saturation effects, which can result in non-linear response.

Figure 8:
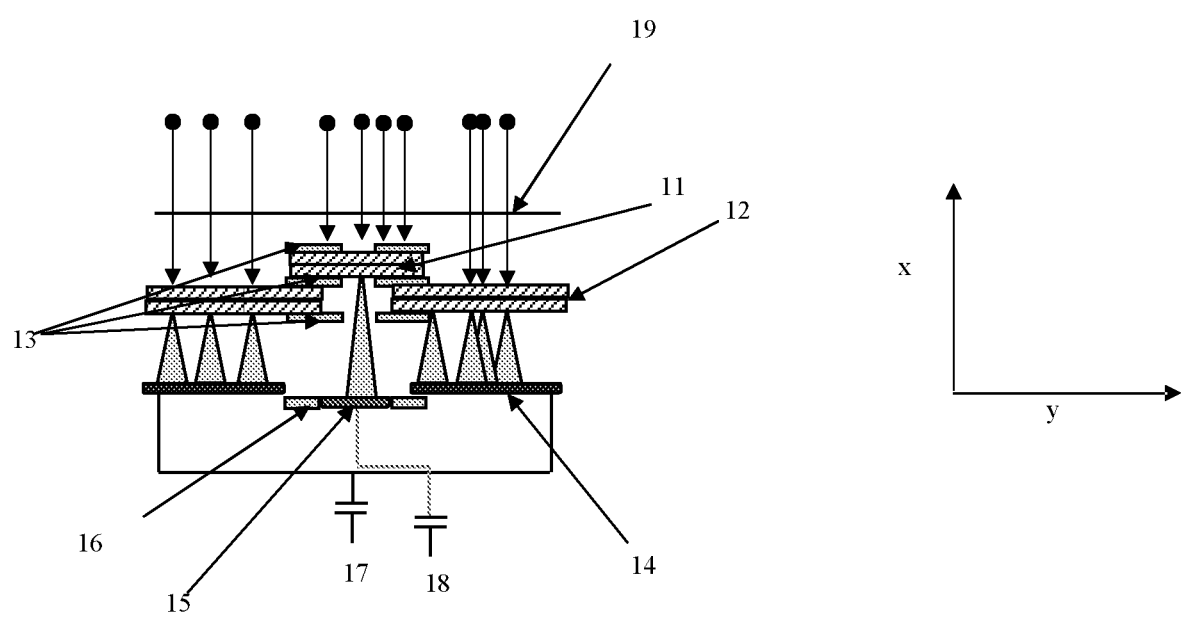
FIG. 8 illustrates schematically a cross-sectional view of an ion detection system in accordance with an embodiment.

FIG. 8 shows an alternative embodiment. The ion detection system illustrated by FIG. 8 comprises two independently controlled chevron pairs of MCP plates 11, 12. One of the pairs of MCP plates 11 may be arranged so that it is aligned with, e.g. overlaps with, the second anode 15, and the other pair of MCP plates 12 may be arranged so that it is aligned with, e.g. overlaps with, the first anode 15. Different bias voltages may be applied to the two pairs of MCP plates 11, 12. Accordingly, the gain for ions which give rise to secondary electrons incident at the larger anode 14 can be controlled to be different to (e.g. greater than) the gain for ions which give rise to secondary electrons incident on the smaller anode 15.

It would also be possible, according to various further embodiments, to provide a single MCP plate that has two or more different regions, where each of the regions has a different electron multiplication gain. One of the regions of the MCP plate may be arranged so that it is aligned with, e.g. overlaps with, the second anode 15, and another region of the MCP plate may be arranged so that it is aligned with, e.g. overlaps with, the first anode 15. The regions may be configured to have different gains, e.g. by applying different bias voltages to the different regions. Accordingly, the gain for ions which give rise to secondary electrons incident at the larger anode 14 can be controlled to be different to (e.g. greater than) the gain for ions which give rise to secondary electrons incident on the smaller anode 15.

A single MCP plate comprising separate regions, where each region has a different electron multiplication gain, may be manufactured using the techniques described above in relation to manufacturing MCP plates with non-active areas. Thus, for example, a single MCP plate with different gain outputs can be made by depositing the electrode material such that active areas can be supplied with separate voltages. The inactive solid glass areas can act as insulators between the different active areas.

According to various further embodiments, an ion detection system is provided that comprises multiple MCP plates and avalanche photodiode ("APD") detectors. The MCP plates and/or the detectors may have different collection areas.

Figure 9:
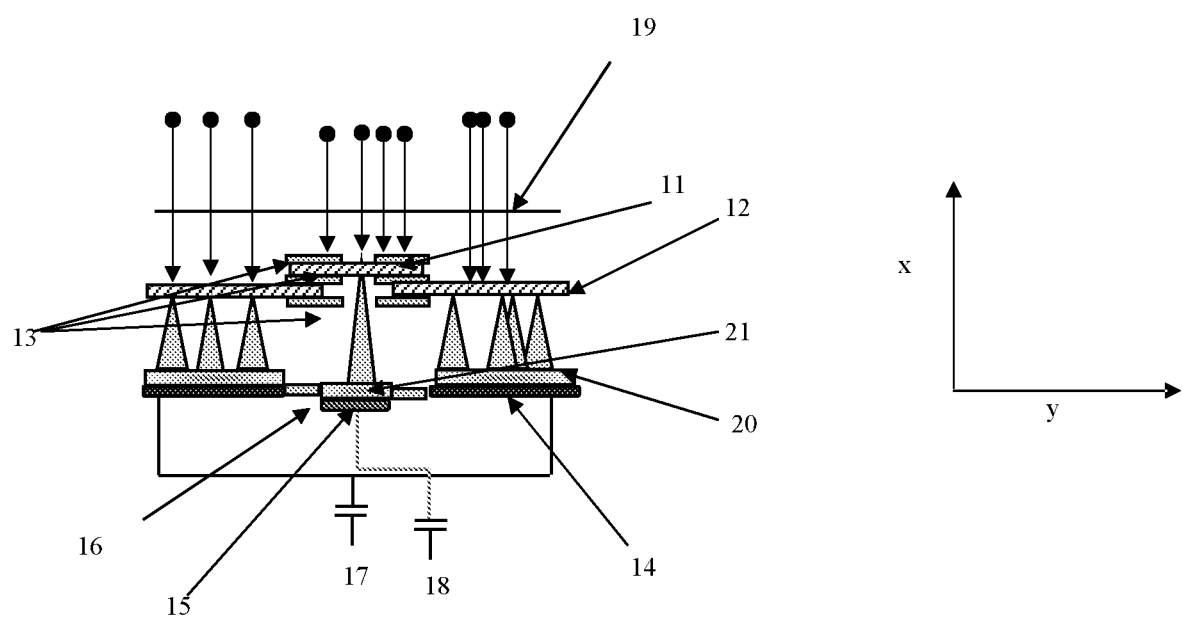
FIG. 9 illustrates schematically a cross-sectional view of an ion detection system in accordance with an embodiment.

FIG. 9 shows an ion detection system in accordance with an embodiment. In this embodiment, single MCP plates are used in respect of a small 11 and a large 12 area MCP plate. These MCP plates may be operated at relatively low gains (e.g. approximately 100-1000), and hence may be capable of linear electron multiplication at very high input ion arrival rates.

Secondary electrons produced at the output of the MCP plates 11, 12 are accelerated onto one or more photodiode sensors or avalanche photodiode detectors ("APDs") or silicon photo multipliers ("SiPMs") 20, 21, which are capable of gains of approximately 1000. The photodiodes 20, 21 may have the same or different effective input areas.

The gains of the MCP plates 11, 12 and/or photodiodes 20, 21 may be independently controllable, e.g. via decoupled high voltage supplies. The output signals from the photodiodes 20, 21 are digitised and combined, as described above, to give wide dynamic range data.

These arrangements are particularly beneficial because photodiodes and avalanche photodiodes ("APDs") are capable of providing a linear response over a wide dynamic range, and have fast response and recovery characteristics. Furthermore, using a single MCP plate, operated at several orders of magnitude lower gain than a standard chevron pair arrangement, can result in greatly reduced output channel saturation, and hence an increased linear response over a wide range of input ion arrival rates.

The combination of one or more single MCP plates 11, 12 and one or more APD detectors 20, 21 according to these embodiments results in an overall gain suitable for the detection of signal on the first anode 14, with a linear response from single ion arrivals (with an output amplitude of approximately 2 mV) up to greater than 25,000 ipp in 1 ns (with an output amplitude of many 10s of volts). Furthermore, as the electron multiplier will not be saturated, the recovery time after a large pulse of ions is relatively fast.

Considering a single time of flight transient, a single mass to charge ratio ("m/z") species may give rise to a very large output amplitude at the input to one of the ADCs 17, and hence may cause ADC saturation (after digitisation and peak detection). Consequently, according to various embodiments, the time-intensity pair recorded for this species by the other ADC 18 may be used in the combined data.

However, it is desirable that the electron multiplier system then recovers within a fraction of the total time for a single time of flight transient. Ideally, the electron multiplier should recover within around 1 ns, and should then be capable of recording a single ion arrival at the MCP plate, which after digitisation by the ADC and peak detection can be added to the same time of flight transient.

Figure 10:
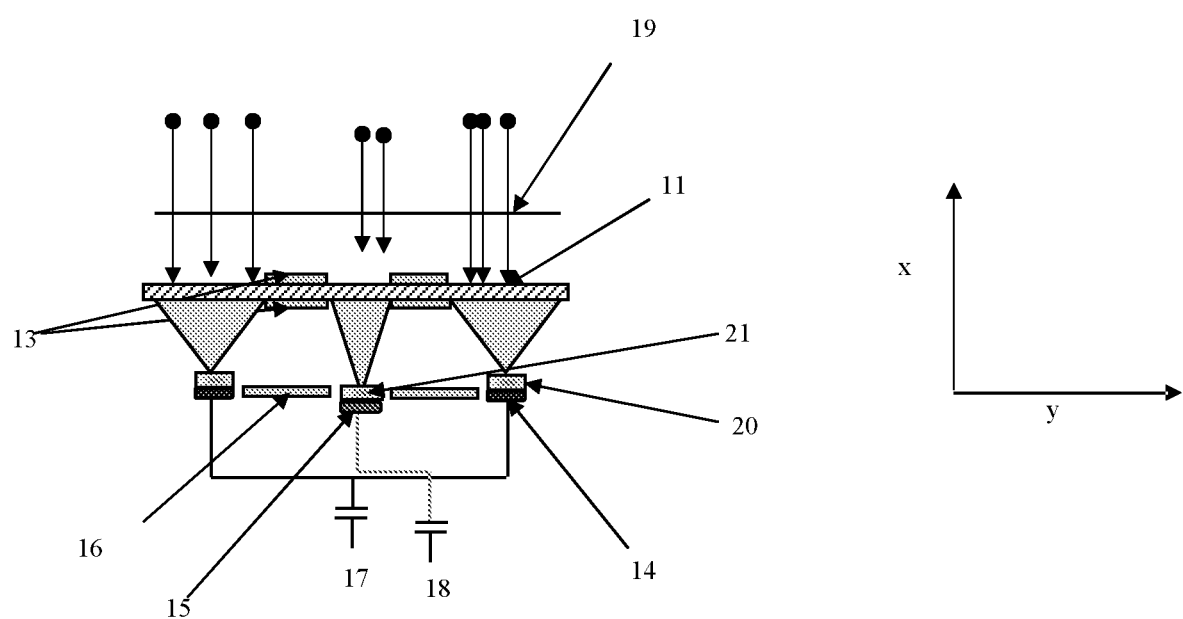
FIG. 10 illustrates schematically a cross-sectional view of an ion detection system in accordance with an embodiment.

FIG. 10 shows a similar arrangement to the arrangement shown in FIG. 9, comprising a single, low gain (e.g. 100-1000) MCP plate 11. Secondary electrons from the output of the MCP plate 11 are accelerated onto photodiode sensors or avalanche photodiode detectors ("APDs") or silicon photo multipliers ("SiPMs") 20, 21, which are capable of gains of approximately 1000.

The photodiodes 20, 21 in FIG. 10 have a relatively small active area and have a substantially similar size. The response time characteristics of the avalanche photodiodes 20, 21, which give rise to fast single ion arrival pulse widths, are related to the capacitance of the photodiodes. The capacitance is governed by the applied bias voltage, the thickness of the diode and the total area. Keeping the diode active area relatively small increases the speed of response, which is beneficial to high resolution time of flight applications.

As the active area of the MCP plate 11 is large in comparison to the diode input area, electrostatic secondary electron focusing may be provided (not shown in FIG. 10) to guide electrons onto the diode surface.

Figure 11:
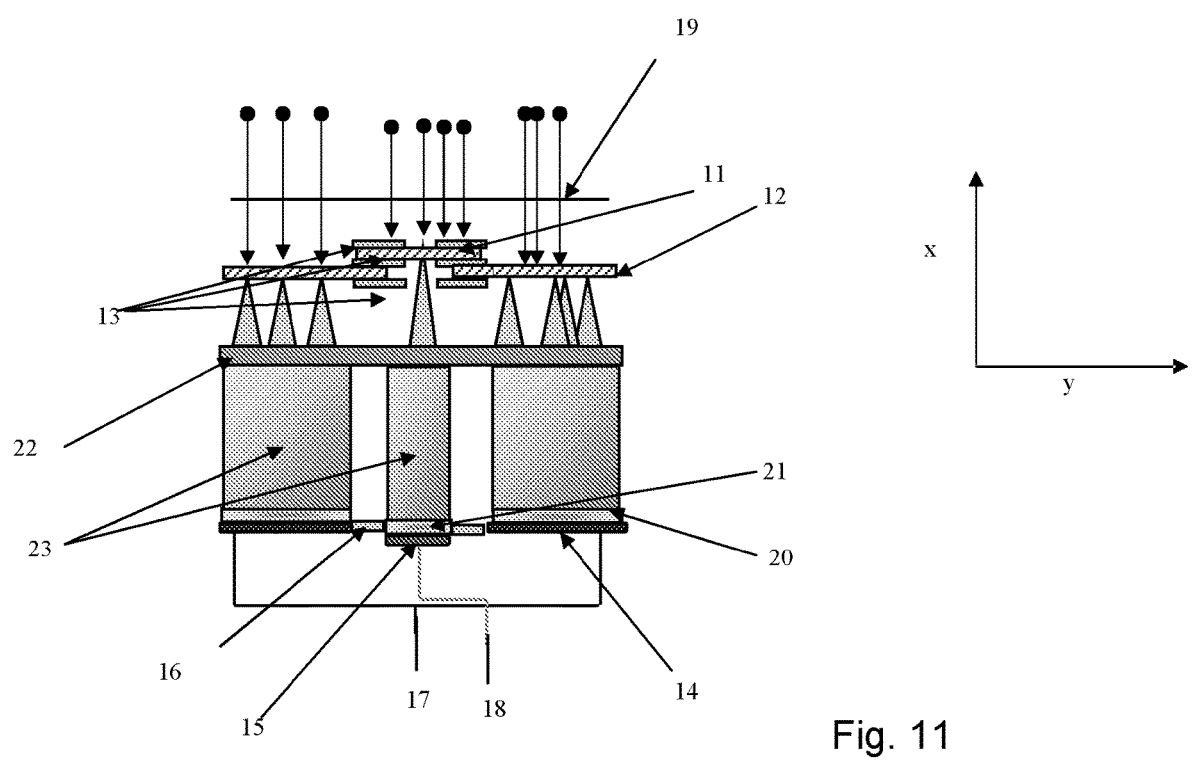
FIG. 11 illustrates schematically a cross-sectional view of an ion detection system in accordance with an embodiment.

FIG. 11 shows another embodiment, where secondary electrons from MCP plates 11, 12 are converted to photons by fast scintillator or phosphor 22. These photons are directed to APDs 20, 21 via light guides 23. Using light guides 23 in this manner negates the requirement for capacitive decoupling of the diode outputs.

Figure 12:
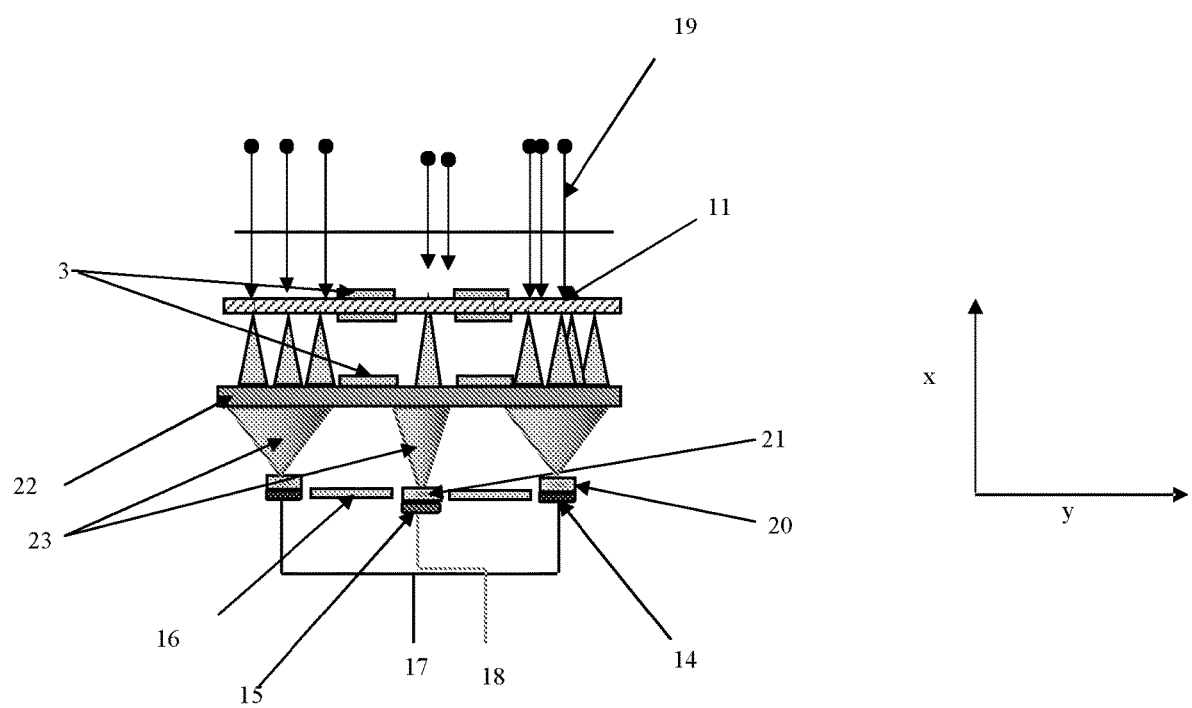
FIG. 12 illustrates schematically a cross-sectional view of an ion detection system in accordance with an embodiment.

FIG. 12 shows a similar embodiment to the embodiments of FIG. 11, comprising a single, low gain (e.g. 100-1000) MCP plate 11. As described in relation to FIG. 10, the physical size of the diodes 20, 21 may be relatively small to achieve the fast response times required for time of flight mass spectrometry.

Accordingly, in the embodiment depicted by FIG. 12, appropriately shaped light guides 23 are provided to ensure photons produced by secondary ions striking the scintillator 22 are directed to the surface of the photo diodes 20, 21. This arrangement is particularly beneficial since using light guides 23 rather than electrostatic lenses (as described in relation to FIG. 10) to direct secondary emissions to the diode surface reduces the complexity of the detector.

The embodiments shown in FIGS. 11 and 12 have the additional benefit that the conversion of electrons into light using scintillator 22 optically decouples the high voltages of the upstream mass spectrometer and electron multiplier from the photo multiplication stage (diodes). Therefore, the output of the diodes 20, 21 may be held at ground potential, simplifying the operation in both positive and negative ion mode, and improving the signal integrity, and reducing the electronic pickup at the input of the ADC.

It should be noted that in the embodiments depicted by FIGS. 10 and 12, the effective input area of the diode(s) 20, 21 may be decreased by (slightly) defocusing the secondary electrons or light directed onto the diode input surface(s) such that the diode input surface(s) is over exposed, and such that some of the electrons or photons are lost. This provides an additional or alternative technique to reduce the gain of the entire electron multiplier system. Furthermore, this may be adjusted prior to data acquisition, and/or varied during data acquisition, e.g. in a predetermined or data dependent manner.

Furthermore, according to various embodiments, the arrangements shown in FIGS. 9, 10, 11 and 12 may be provided with arrays of multiple independent photodiodes, e.g. to increase the total active area, without decreasing the response time.

In the embodiments described in FIGS. 7, 8 and 9, the gain of the two electron multipliers may be set to be the same or different values. This may be achieved by reducing the bias voltage across the electron multiplication stage or stages.

According to various further embodiments, the primary ion-electron strike efficiency of one or both of the detector devices may be changed, e.g. to produce a lower effective ion arrival rate at one of the detectors, and hence to reduce any electron multiplication saturation effects. In order to reduce the number of output electrons per ion strike at the input, the initial yield of electrons from an ion arrival at the input of the multiplier may be reduced or altered, e.g. by altering the coating or material at the input.

Reducing the secondary electron yield per primary ion strike to a low value (e.g. ~<1 electron per ion) also reduces the efficiency of the ion to electron conversion. Therefore, some of the ions arriving at the electron multiplier will result in no electrons being released. This reduction in electron conversion efficiency is equivalent to a reduction in the ion arrival rate over the input of the detector.

Most electron multipliers have a primary ion-electron conversion dynode coated with or made from a strongly electron emissive surface. The yield of electrons from an incoming ion depends on the nature of this surface and the energy and velocity of the incoming ions. Surfaces such as magnesium oxides, aluminium oxides and titanium oxides or mixtures of these can be used to achieve high primary electron yields. For example, for input ions having a mass to charge ratio ("m/z") of 500, a single charge and a kinetic energy of 10 kV, the secondary electron yield from the initial ion strike is between 5-10 electrons per ion. The distribution of the primary strike yield follows a Poisson distribution.

According to various embodiments, the input surface of the first MCP plate 11, e.g. in the embodiments depicted in FIGS. 7-13, may be at least partially coated with a lower electron emissive surface, resulting in lower overall gain at the same detector bias voltage, or lower ion-electron or electron-electron conversion efficiency. Carbon, for example, has a low secondary electron yield. Coating the primary strike surface with carbon or depositing some carbon onto this surface can reduce the electron yield and hence reduces efficiency of ion detection.

As the primary strike yield is not related to the voltage drop over the electron multiplication stage, the overall gain of the multiplier may be adjusted independently.

Using this technique, although the ion arrival rate at the first MCP plate 11 is unchanged, the effective ion arrival rate, accounting for the ion-to-electron conversion efficiency, e.g. recorded using one of the ADCs 18, can be reduced with or without a reduction of overall multiplier gain. Accordingly, the dynamic range of the combined system may be increased by the techniques disclosed herein.

Although various embodiments have been described in terms of two separate electron multiplication elements, in various further embodiments, the composition of the emissive coating applied to a continuous primary ion-electron conversion surface may be varied over the surface to produce the same effect.

According to various embodiments, one or more masks may be provided in front of the multiplier. A means for spreading the incident ion arrivals may be provided over the input of the first detector, e.g. to reduce the overall ion arrival rate and the ion arrival rate at each individual channel of the MCP plate.

Figure 13:
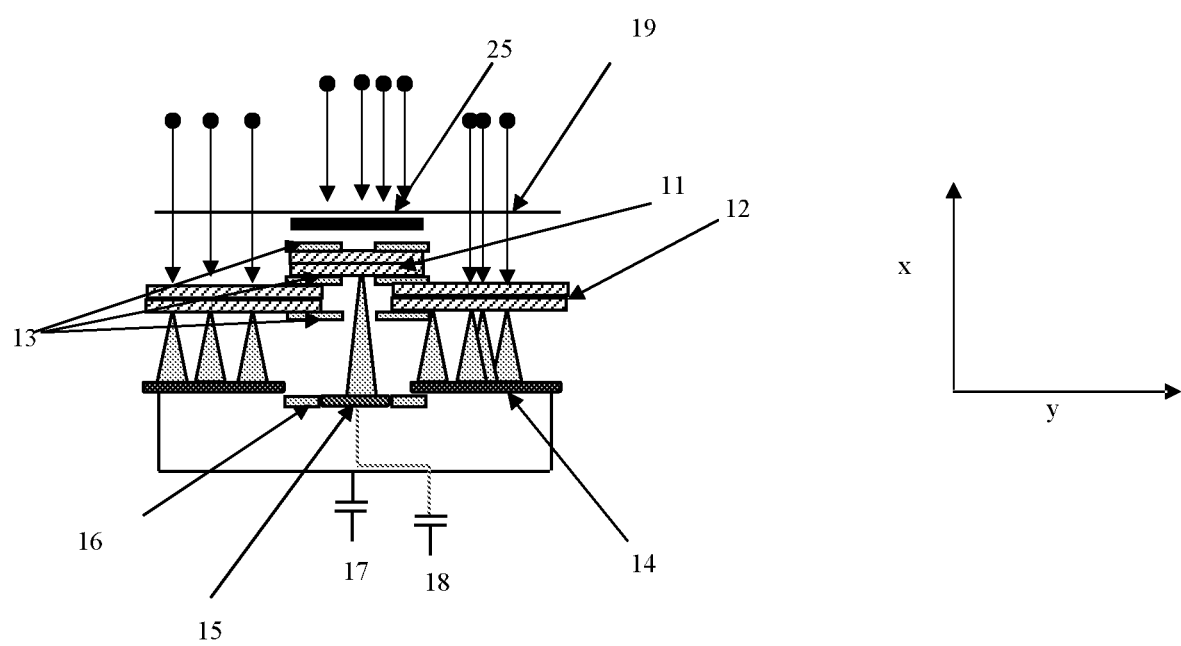
FIG. 13 illustrates schematically a cross-sectional view of an ion detection system in accordance with an embodiment.

FIG. 13 shows an embodiment, where the input ion arrival rate to the first electron multiplier 11 is physically reduced by positioning a restriction grid or ion transmission mask 25 in front of the input to the multiplier.

In the case of an MCP plate as shown in FIG. 13, the ion arrival rate reaching each individual channel of the MCP may be reduced, e.g. to avoid saturation of individual channels.

At high ion arrival rates, the probability of two or more ions entering a single MCP channel within the recovery time of that channel becomes statistically significant, resulting in a non-linear output. Simply reducing the number of MCP channels available for incident ion arrivals does not change the ion arrival rate for the remaining individual MCP channels.

It is therefore beneficial in these embodiments to provide a means to ensure that multiple ion events which are transmitted through an aperture of the mask 25 are distributed over multiple input MCP channels in the MCP plate 11. This can be achieved, e.g. by actively defocusing the ions as they pass through the mask 25 and/or by arranging the mask and upstream conditions such that only ions which take particular angular trajectories towards the detector are transmitted.

In an orthogonal time of flight ("oa-ToF") system there is an appreciable spread in axial energy of ions prior to orthogonal acceleration. This spread results in ions with the same mass to charge ratio ("m/z"), but different axial energies, taking different paths as they travel towards the detector.

Although FIG. 13 shows ions arriving normal to the surface of the electron multiplier, in practice ions may arrive with a range of incident angles with respect to the plane of the electron multiplier, e.g. due to this initial axial energy and axial energy spread. The dimensions and orientation of the apertures in the mask 25 can be adjusted to ensure that the ion arrival rate per MCP channel is attenuated.

The mask 25 may have aperture sizes which are, for example, in the 10s of microns, to work efficiently. In one embodiment the mask is itself made of a large pore MCP, e.g. constructed without electron emissive coating and operated without application of a bias voltage across the plate. The MCP plate may be coated with an electrically conductive coating (metalized) and set at a potential, e.g. substantially the same as the input surface of the first MCP plate 11, such that ions which pass through the mask experience a substantially field free region.

Figure 14:
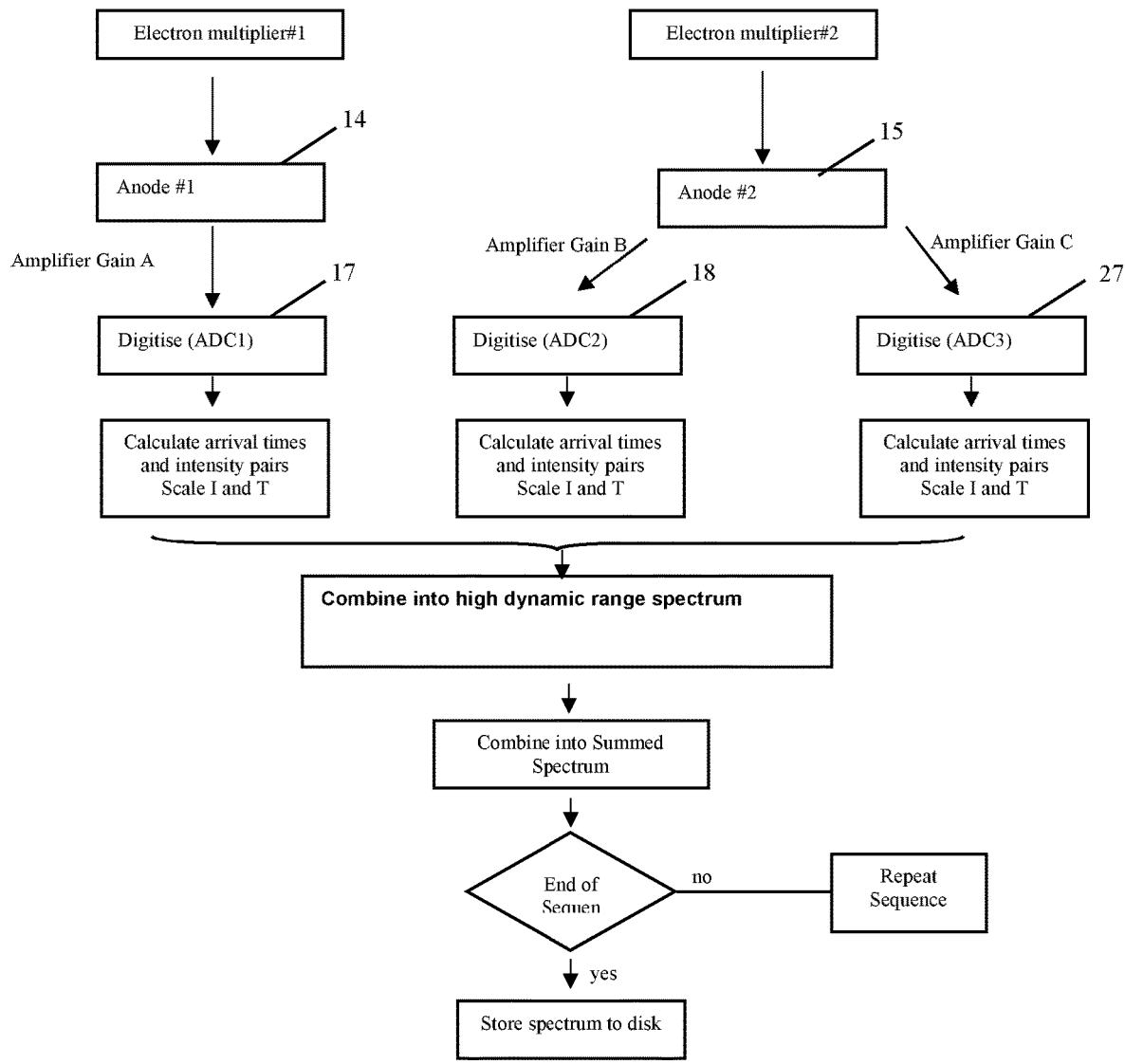
FIG. 14 illustrates schematically an ion detection system in accordance with an embodiment.

FIG. 14 illustrates an embodiment in which two separate electron multiplication devices are utilised together with combinations of peak detecting ADCs.

The electron multipliers may differ in gain, and/or in input area and/or primary ion-electron conversion efficiency and/or input ion arrival rate.

Figure 15:
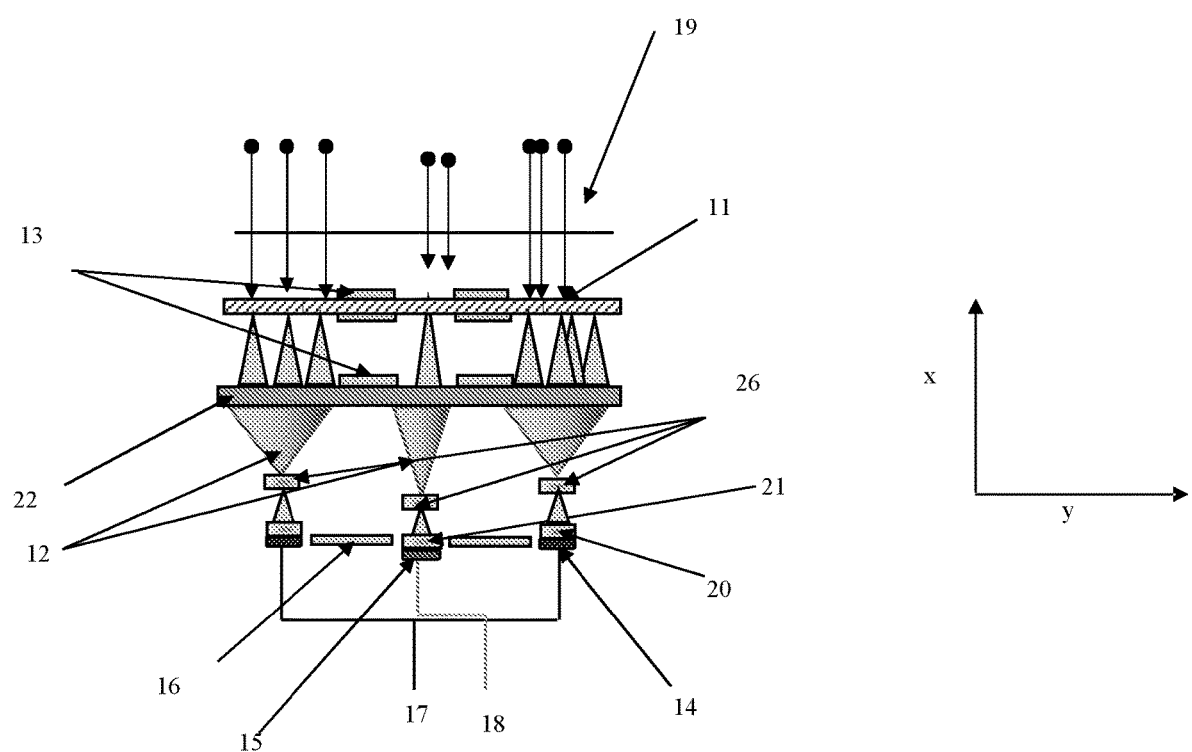
FIG. 15 illustrates schematically a cross-sectional view of an ion detection system in accordance with an embodiment.

FIG. 15 shows another embodiment. In this embodiment, secondary electrons from a low gain MCP are incident on scintillator 22 and the resulting photons are directed to be incident on photocathode 26. The photocathodes 26 produce secondary electrons in response to the incident photons. These electrons are then directed towards photodiodes 20, 21.

Converting the photons back to electrons using the photocathodes 26, before detecting the electrons using the two or more photodiodes in this manner, allows the electrons to be accelerated to high energy, e.g. using a suitable potential between the photocathode 26 and the surface of the photodiodes 20, 21. The gain of the photodiodes 20, 21 is related to the incident energy of electrons, and can therefore be increased using this embodiment.

Figure 16:
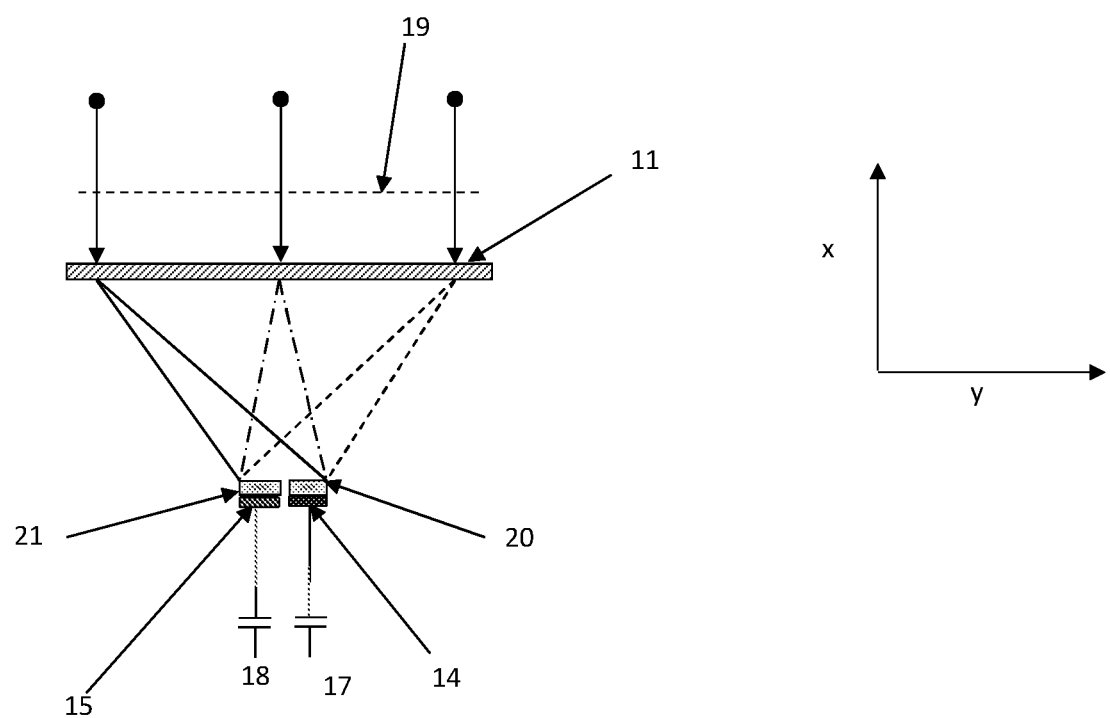
FIG. 16 illustrates schematically a cross-sectional view of an ion detection system in accordance with an embodiment.

FIG. 16 shows another embodiment. In this embodiment, secondary electrons arising from ions striking at any point on the ion collection surface 11 are focussed or the system is otherwise arranged such that the resulting electron cloud illuminates two or more output devices or secondary electron collection devices 14, 15. The system may be arranged such that the number of electrons incident of each of the output devices 14, 15 is substantially the same. In this manner the electron cloud arising from each ion strike gives rise to a signal output on multiple anodes or output devices 14, 15. The individual outputs may then be amplified and digitised separately.

In these embodiments, the signal from the first anode 14 may be amplified by a first amplifier and digitised by a first ADC 17. The digitised signal may then be reduced to one or more time and intensity pairs, e.g. in the manner described above.

Signal from the second anode 15 may be split into two parts. One part may be amplified by a second amplifier and digitised by a second ADC 18 before being reduced to one or more time-intensity pairs. The second part may be amplified by a third amplifier, digitised by a third ADC and reduced to one or more time-intensity pairs.

In these embodiments, the second amplifier may have a higher gain than the third amplifier which in turn may have higher gain than the first amplifier.

The time-intensity pairs may be adjusted in time and intensity, e.g. based on previously determined calibration routines, to account for time differences between the different signal paths, and to normalise the intensity for the different overall gains and collection efficiencies for each of the signal paths.

The time-intensity pairs recorded within a single time of flight transient may then be combined into a single high dynamic range spectrum. Finally, this high dynamic range spectrum may be combined with other, previously recorded, spectra, e.g. in the manner described above.

Other amplifier and digitiser combinations (such as any one or more of the combinations described herein) can be envisaged with two or more output devices.

The embodiment depicted in FIG. 16 shows a single MCP plate 11 used in conjunction with two photo-diode detectors 20, 21. The same principle may be used with multiple MCP plates and/or with multiple metal anodes 14, 15 to effectively split the electron cloud from each ion strike.

In addition, this approach of splitting the signal from each incident ion may be achieved using other detector arrangements.

For example, secondary electrons from ions arriving at any region of an input MCP 11 may be spread over the surface of a scintillator 22 and the resultant photons may be distributed over multiple photocathodes 26 to produce electrons from the incident photons. The electrons from these photocathodes 26 may be detected by further photodiodes 20, 21 and/or collection anodes 14, 15.

Alternatively, rather than spreading the electron cloud from each ion strike over substantially the same area, photons from the incident secondary electrons may be spread over multiple photocathodes 26 using a suitable light guide 23.

The same method may be used to split the secondary electrons from each ion strike over multiple output devices for a continuous dynode or discreet dynode detector rather than a detector comprising a micro channel plate.

These methods in conjunction with multiple amplification and digitisation stages can be used to extend the dynamic range while avoiding amplifier input saturation effects.

Many other combinations of electron multiplication devices may be envisaged in addition to those already mentioned, in accordance with various embodiments.

According to various further embodiments, continuous or discreet dynode electron multipliers or photomultipliers may be used in combination with the multipliers and techniques described herein.

According to various embodiments, the ion detection system may be calibrated. U.S. Pat. No. 9,324,545 (Micromass) discloses a method of calibrating a dual gain ADC system. However, this method is not suitable for calibrating two independent electrode outputs according to the various embodiments described herein.

According to various embodiments, time and intensity differences between the first and second signals (i.e. from the separate electron multipliers and/or collection electrodes and ADCs) are measured and subsequently corrected. The gain of any separate electron multipliers may also be adjusted. The calibration method may involve a combination of the techniques described in U.S. Pat. No. 9,324,545 (Micromass), together with measuring a signal generated by a reference compound ionised in the ion source and transmitted to the ion detector.

Alternatively, the different outputs may be calibrated using a single reference compound ionised in the ion source, which may e.g. be adjusted over a range of ion arrival rates. The adjustment of ion arrival rates over a suitable dynamic range may be achieved by one or a combination of altering sensitivity, altering ion transmission, and operating in either a continuous beam delivery mode or a pulsed delivery mode (such as ion mobility mode).

It will be appreciated that various embodiments can extend the linear dynamic range of a digitiser system and can also extend the linear dynamic range of an electron multiplication system in combination with a digitiser system.

Various embodiments are directed to a method of mass spectrometry in which ions are pulsed into a time of flight separation region. An ion detector is provided that is configured to produce secondary electrons in response to incident ions. A first collection electrode and a second collection electrode are provided, where the first collection electrode receives secondary electrons in response to a different population of incident ions than the second collection electrode for a given average ion arrival rate at the detector input.

A first signal and a second signal are output from the first and second collection electrodes. The first signal is digitised to produce a first digitised signal and the second signal is digitised to produce a second digitised signal. First intensity and arrival time, mass or mass to charge ratio data is determined from the first digitised signal, and second intensity and arrival time, mass or mass to charge ratio data is determined from the second digitised signal. The first intensity and arrival time, mass or mass to charge ratio data and the second intensity and arrival time, mass or mass to charge ratio data are combined to form a combined data set.

The anodes may have different sizes. The first collection electrode may have a larger effective area or larger physical area than the second collection electrode.

A dual gain ADC may be provided on one or both anodes. A first signal and a second signal may be output from the first collection electrode and/or a third and fourth signal may be output from the second collection electrode, where the first, second, third and fourth signals respectively correspond to the first signal multiplied or amplified by a first gain, the first signal multiplied or amplified by a second different gain, the third signal multiplied or amplified by a third gain, and the fourth signal multiplied or amplified by a fourth different gain. The intensity of the signal or signals from the first and second collection electrodes may be scaled by one or more appropriate scaling factors.

The detectors may have different gains. The first collection electrode may receive secondary electrons from a first electron multiplier configuration in response to the arrival of first incident ions, and the second collection electrode may receive second secondary electrons from a second electron multiplier configuration in response to the arrival of second incident ions. The gain or primary ion to electron efficiency or yield may be different for the first and second electron multiplier configurations.

According to various embodiments, multiple peak detecting ADCs are attached to independent secondary electron collection electrodes, which may have the same or different effective areas. Secondary electrons arise from ion arrivals at the input to the same or different electron multipliers or photo multipliers. The digitised signals are reduced to time and intensity pairs and combined into a single high intensity spectrum based on the degree of saturation measured and flagged during processing of individual time of flight transients. The measured arrival time and intensity is scaled or adjusted prior to combining the time intensity pairs to account for the difference in ion or electron collection efficiency, multiplier gain, ion to electron yield, propagation delays and physical displacement of the components of the detector giving rise to time shifts prior to or after digitisation.

Various embodiments can be used to extend the dynamic range of an oa-TOF digitiser system. Various embodiments provide methods for avoiding electron multiplier saturation at high ion arrival rates.

Although the present invention has been described with reference to preferred embodiments, it will be understood by those skilled in the art that various changes in form and detail may be made without departing from the scope of the invention as set forth in the accompanying claims.

The invention claimed is:

1. An ion detection system comprising:
one or more first devices configured to produce secondary electrons in response to incident ions, the one or more first devices comprising a first ion collection region and a second ion collection region, wherein the one or more first devices are configured to produce first secondary electrons in response to one or more ions incident at the first ion collection region and to produce second secondary electrons in response to one or more ions incident at the second ion collection region;
a first output device configured to output a first signal in response to first secondary electrons produced by the one or more first devices;
a second output device configured to output a second signal in response to second secondary electrons produced by the one or more first devices;
a digitiser configured to digitise the first signal to produce a first digitised signal;
a digitiser configured to digitise the second signal to produce a second digitised signal;
processing circuitry configured to determine first intensity and arrival time, mass or mass to charge ratio data from the first digitised signal;
processing circuitry configured to determine second intensity and arrival time, mass or mass to charge ratio data from the second digitised signal; and
processing circuitry configured to combine the first intensity and arrival time, mass or mass to charge ratio data and the second intensity and arrival time, mass or mass to charge ratio data to form a combined data set.

2. The ion detection system of claim 1, wherein:
the first output device is configured to output a first signal in response only to first secondary electrons produced by the one or more first devices and the second output device is configured to output a second signal in response only to second secondary electrons produced by the one or more first devices; or
the first output device is configured to output a first signal in response to first secondary electrons produced by the one or more first devices and in response to second secondary electrons produced by the one or more first devices, and the second output device is configured to output a second signal in response to second secondary electrons produced by the one or more first devices and in response to first secondary electrons produced by the one or more first devices.

3. The ion detection system of claim 1, wherein:
the one or more first devices comprises a first micro-channel plate ("MCP") device and a second micro-channel plate ("MCP") device;
the ion detection system is configured to apply a first bias voltage to the first micro-channel plate ("MCP") device; and
the ion detection system is configured to apply a second different bias voltage to the second micro-channel plate ("MCP") device.

4. The ion detection system of claim 1, wherein:
the one or more first devices comprise a micro-channel plate ("MCP") device;
the ion detection system is configured to apply a first bias voltage to a first region of the micro-channel plate ("MCP") device that corresponds to the first ion collection region; and
the ion detection system is configured to apply a second different bias voltage to a second different region of the micro-channel plate ("MCP") device that corresponds to the second ion collection region.

5. The ion detection system of claim 1, further comprising:
a first photodiode or photomultiplier device, wherein the first output device comprises the first photodiode or photomultiplier device or wherein the first photodiode or photomultiplier is coupled to or includes the first output device; and
a second photodiode or photomultiplier device, wherein the second output device comprises the second photodiode or photomultiplier device or wherein the second photodiode or photomultiplier is coupled to or includes the second output device;
wherein the one or more first devices comprise one or more micro-channel plate ("MCP") devices configured to produce secondary electrons in response to incident ions; and
wherein the first and/or second photodiode or photomultiplier device is arranged to receive the secondary electrons produced by the one or more micro-channel plate ("MCP") devices in response to incident ions.

6. The ion detection system of claim 1, further comprising:
a first photodiode or photomultiplier device, wherein the first output device comprises the first photodiode or photomultiplier device or wherein the first photodiode or photomultiplier is coupled to or includes the first output device;
a second photodiode or photomultiplier device, wherein the second output device comprises the second photodiode or photomultiplier device or wherein the second photodiode or photomultiplier is coupled to or includes the second output device; and
one or more devices configured to produce photons in response to electrons produced by the ion detection system in response to ions incident at the first and/or second ion collection regions;
wherein the one or more first devices comprise one or more micro-channel plate ("MCP") devices configured to produce secondary electrons in response to incident ions; and
wherein the one or more devices configured to produce photons in response to electrons are arranged to receive the secondary electrons produced by the one or more micro-channel plate ("MCP") devices in response to incident ions.

7. The ion detection system of claim 1, further comprising one or more electron focusing devices configured to focus electrons produced by the ion detection system in response to ions incident at the first and/or second ion collection regions.

8. The ion detection system of claim 7, wherein the one or more electron focusing devices are configured to focus electrons onto the first and/or second output device.

9. The ion detection system of claim 1, further comprising one or more devices configured to produce photons in response to electrons produced by the ion detection system in response to ions incident at the first and/or second ion collection regions.

10. The ion detection system of claim 9, further comprising one or more focusing or defocusing devices configured to focus or defocus the photons produced by the ion detection system in response to ions incident at the first and/or second ion collection regions.

11. The ion detection system of claim 9, further comprising one or more devices configured to produce electrons in response to the photons produced by the ion detection system in response to ions incident at the first and/or second ion collection regions.

12. The ion detection system of claim 11, wherein the ion detection system is configured to accelerate the electrons produced in response to the photons.

13. The ion detection system of claim 1, wherein:
the one or more first devices comprise a micro-channel plate ("MCP") device comprising a first active region, a second different active, and one or more inactive regions; and
the one or more inactive regions are arranged between the first active region and the second active region so as to prevent the first output device outputting a first signal and the second output device outputting a second signal in response to a single ion incident at the one or more first devices.

14. The ion detection system of claim 1, wherein:
the digitiser is configured to digitise a first part of the first signal to produce the first digitised signal;
the ion detection system further comprises a digitiser configured to digitise a second part of the first signal to produce a third digitised signal; and
the ion detection system is configured such that the first part of the first signal is multiplied, amplified or attenuated by a first gain prior to being digitised, and the second part of the first signal is multiplied, amplified or attenuated by a third different gain prior to being digitised.

15. The ion detection system of claim 14, further comprising a splitter or divider configured to split or divide the first signal into the first part of the first signal and the second part of the first signal.

16. The ion detection system of claim 1, wherein:
the one or more first devices are configured to produce first secondary electrons in response to one or more ions incident at the first ion collection region with a first ion to electron conversion efficiency; and
the one or more first devices are configured to produce second secondary electrons in response to one or more ions incident at the second ion collection region with a second different ion to electron conversion efficiency.

17. The ion detection system of claim 16, wherein:
the one or more first devices comprise a first region that comprises or corresponds to the first ion collection region and that comprises a first material or coating; and
the one or more first devices comprise a second different region that comprises or corresponds to the second ion collection region and that comprises a second different material or coating.

18. The ion detection system of claim 1, further comprising:
one or more masks or grids upstream of the one or more first devices; and
one or more devices configured to cause ions that pass through the mask or grid to spread out, defocus or diverge between the mask or grid and the one or more first devices.

19. The ion detection system of claim 18, wherein the one or more masks or grids are configured such that ions are incident at the first ion collection region with a first ion arrival rate and such that ions are incident at the second ion collection region with a second different ion arrival rate.

20. A method of detecting ions comprising:
producing first secondary electrons from one or more first devices in response to one or more ions incident at a first ion collection region of the one or more first devices;
producing second secondary electrons from the one or more first devices in response to one or more ions incident at a second ion collection region of the one or more first devices;
outputting a first signal from a first output device in response to first secondary electrons produced by the one or more first devices;
outputting a second signal from a second output device in response to second secondary electrons produced by the one or more first devices;
digitising the first signal to produce a first digitised signal;
digitising the second signal to produce a second digitised signal;
determining first intensity and arrival time, mass or mass to charge ratio data from the first digitised signal;
determining second intensity and arrival time, mass or mass to charge ratio data from the second digitised signal; and combining the first intensity and arrival time, mass or mass to charge ratio data and the second intensity and arrival time, mass or mass to charge ratio data to form a combined data set.

* * * * *